United States Patent [19]

Bishop et al.

[11] Patent Number: 4,589,140
[45] Date of Patent: May 13, 1986

[54] METHOD OF AND APPARATUS FOR REAL-TIME HIGH-SPEED INSPECTION OF OBJECTS FOR IDENTIFYING OR RECOGNIZING KNOWN AND UNKNOWN PORTIONS THEREOF, INCLUDING DEFECTS AND THE LIKE

[75] Inventors: Robert Bishop, Brookline; Derek Schwenke, Lexington, both of Mass.

[73] Assignee: Beltronics, Inc., Brookline, Mass.

[21] Appl. No.: 477,264

[22] Filed: Mar. 21, 1983

[51] Int. Cl.⁴ .............................................. G06K 9/62
[52] U.S. Cl. .......................................... 382/8; 382/14; 382/27; 358/106
[58] Field of Search ................... 382/8, 25, 34, 50, 52, 382/14, 27, 30; 358/106, 107, 101; 364/488, 489, 490, 491, 507; 356/237

[56] References Cited

U.S. PATENT DOCUMENTS

| | | | |
|---|---|---|---|
| 3,887,762 | 6/1975 | Uno et al. | 382/8 |
| 4,014,000 | 3/1977 | Uno et al. | 382/8 |
| 4,345,312 | 8/1982 | Yasuye et al. | 358/107 |

OTHER PUBLICATIONS

Arlan et al, "High-Resolution Computer-Controlled TV System for Hybrid Circuit Inspection", *Proc. of SPIE*, vol. 182, Apr., 1979, pp. 130–139.

Automatix, Autovision II Programmable Visual Inspection System, 1981.

Machine Intelligence Corp., Model VS-100 Machine Vision System.

Robert C. Rastrick, III, *S.P.I.E. Solid State Imaging Devices*, vol. 116, pp. 76–81, "An Automatic Optical Printed Circuit Inspection System", 1977.

Dan Antonsson et al, "A System for Automatic Visual Inspection of Printed Circuit Boards", 1979.

Masakazu Ejiri et al, "A Process for Detecting Defects in Complicated Patterns", *Comp. Graphics & Image Process*, vol. 2, 1973, pp. 326–339.

*Primary Examiner*—Leo H. Boudreau
*Attorney, Agent, or Firm*—Rines and Rines, Shapiro and Shapiro

[57] ABSTRACT

This disclosure is concerned with real-time high-speed inspection of objects involving storing digital signal mask information of optical scans of objects at different magnifications, but with substantially the same field of view, and comparing digital mask information obtained by run scans of objects-to-be-inspected, at different magnifications, with the stored mask information to identify known or unknown portions of the objects, with adaptability for rapid "teaching" of large sets of objects for storage and subsequent comparison with real objects under inspection.

32 Claims, 27 Drawing Figures (a) IMAGE IN HIGH RESOLUTION LARGE FIELD CCD SLIDING WINDOW (b) HIGH MAGNIFICATION  (c) LOW MAGNIFICATION

IMAGES IN CONVENTIONAL CAMERA VIEWING MICROSCOPE EYEPIECE

IMAGE IN SLIDING WINDOW MEMORY (a) HIGH MAGNIFICATION FOV (b) LOW MAGNIFICATION FOV (a)  (b) IMAGE IN SLIDING WINDOW MEMORY  (c) IMAGE IN SLIDING WINDOW MEMORY

FIG. 14.

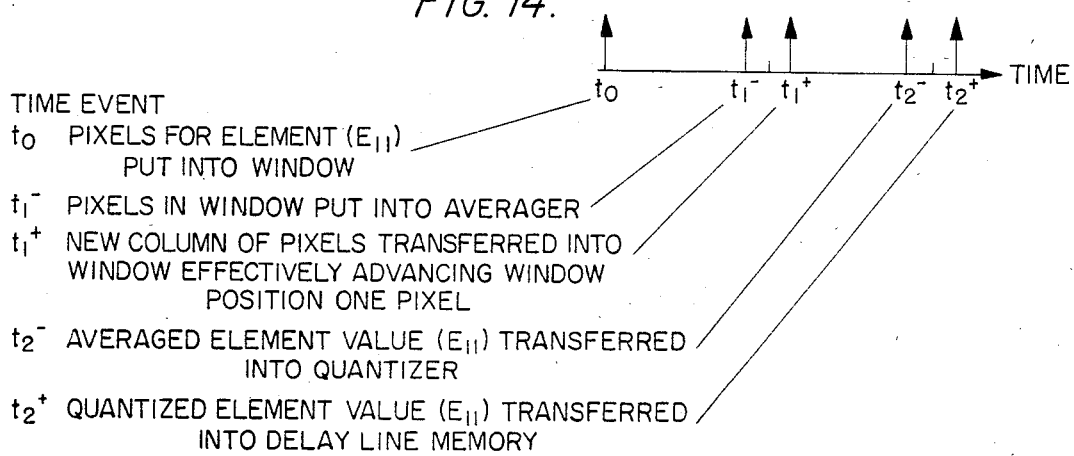

TIME EVENT
- $t_0$ PIXELS FOR ELEMENT ($E_{11}$) PUT INTO WINDOW
- $t_1^-$ PIXELS IN WINDOW PUT INTO AVERAGER
- $t_1^+$ NEW COLUMN OF PIXELS TRANSFERRED INTO WINDOW EFFECTIVELY ADVANCING WINDOW POSITION ONE PIXEL
- $t_2^-$ AVERAGED ELEMENT VALUE ($E_{11}$) TRANSFERRED INTO QUANTIZER
- $t_2^+$ QUANTIZED ELEMENT VALUE ($E_{11}$) TRANSFERRED INTO DELAY LINE MEMORY

FIG. 15.

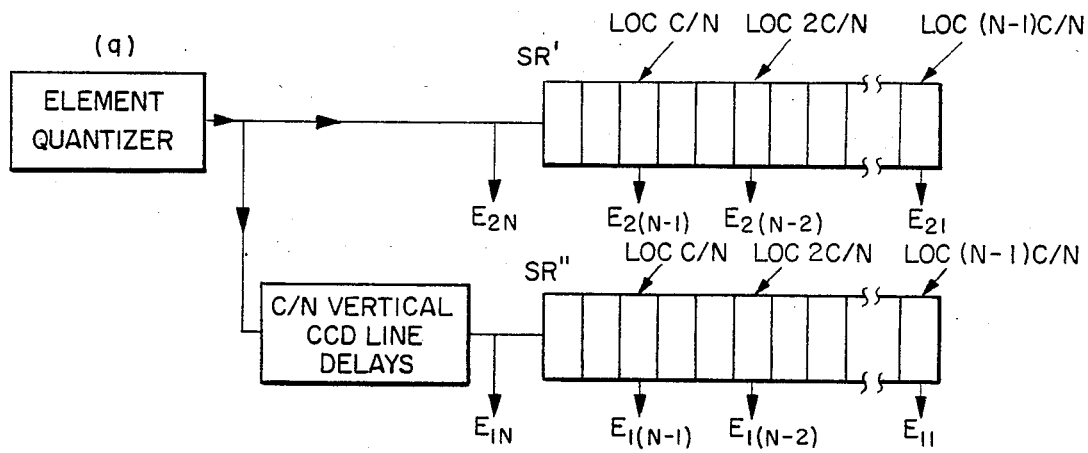

POSITION OF ELEMENTS AFTER A TOTAL DELAY EQUAL TO:
(N-1)C/N CLOCK CYCLES+C/N VERTICAL CCD LINES WHERE:
C = TOTAL NUMBER OF PIXELS ALONG ONE AXIS OF THE FOV
N = TOTAL NUMBER OF ELEMENTS ALONG ONE AXIS OF THE FOV
C/N = TOTAL NUMBER OF PIXELS ALONG ONE AXIS OF AN ELEMENT

FIG. 17.

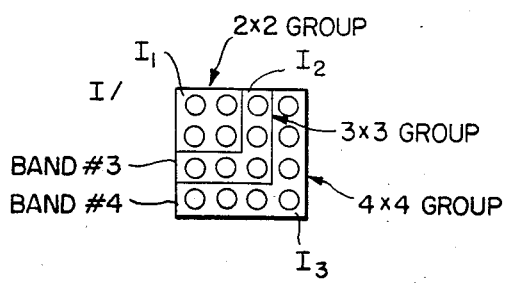

FIG. 19.

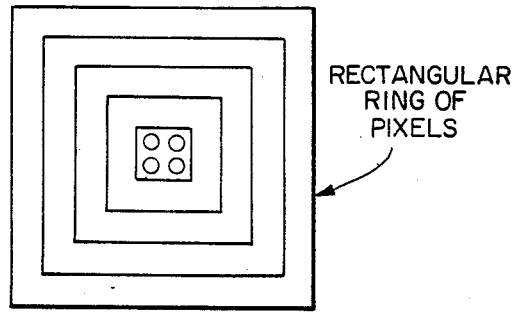

ELEMENT DELAY UNIT

POSITION OF ELEMENTS AFTER A TOTAL DELAY EQUAL TO
(N-1)C/N CLOCK CYCLES + (N-1)C/N VERTICAL
CCD LINE DELAYS

NOTES:
1. $T_n$ = THRESHOLD VALUE FOR THE n x n PIXEL ELEMENT
2. COMP. = DIGITAL COMPARATOR
3. $EL_n$ = QUANTIZED ELEMENT VALUE (0 OR 1) FOR THE n x n PIXEL ELEMENT
4. $EL_n$ = 1 IF $S_n > T_n$
   $EL_n$ = 0 IF $S_n < T_n$

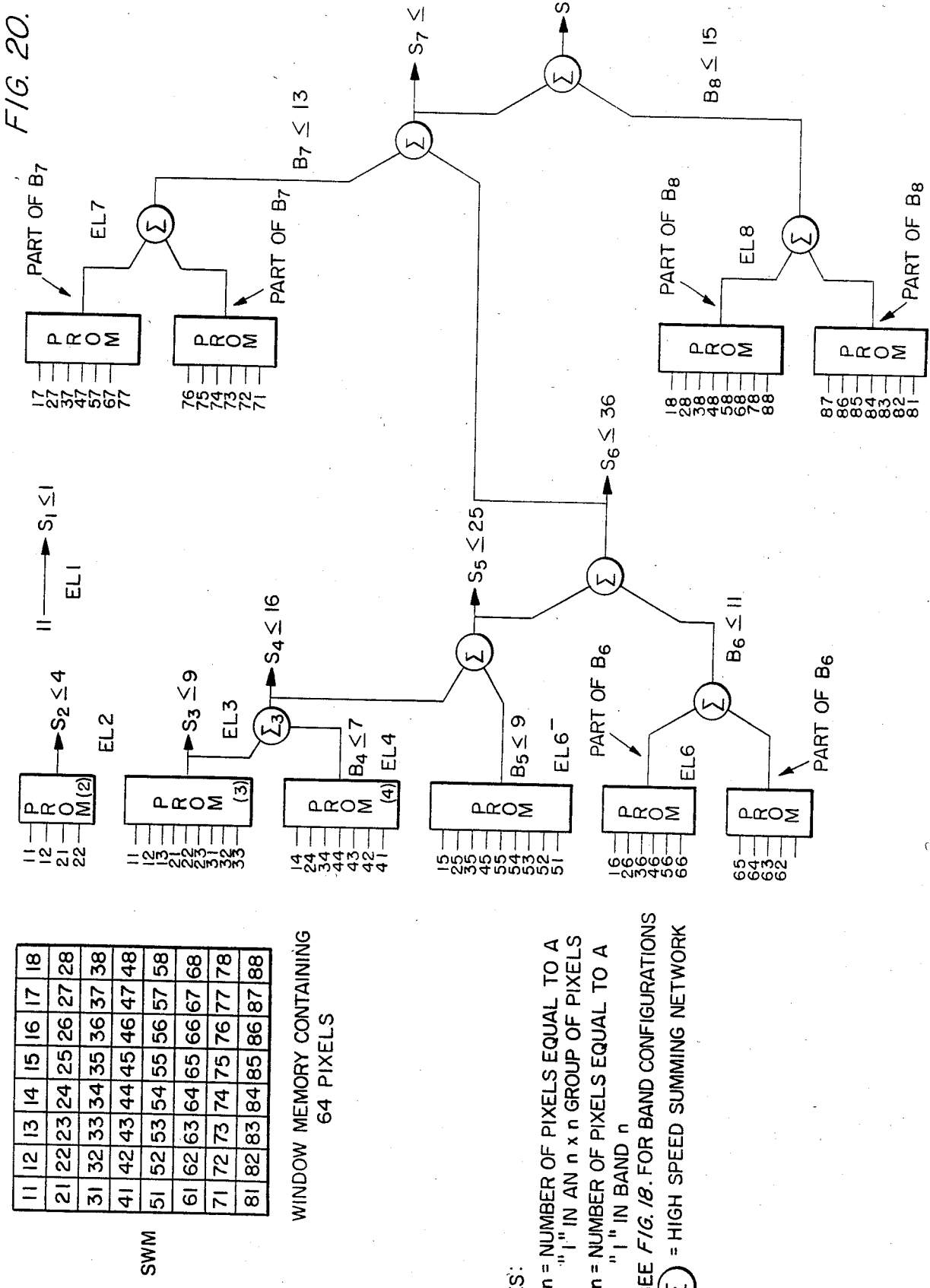

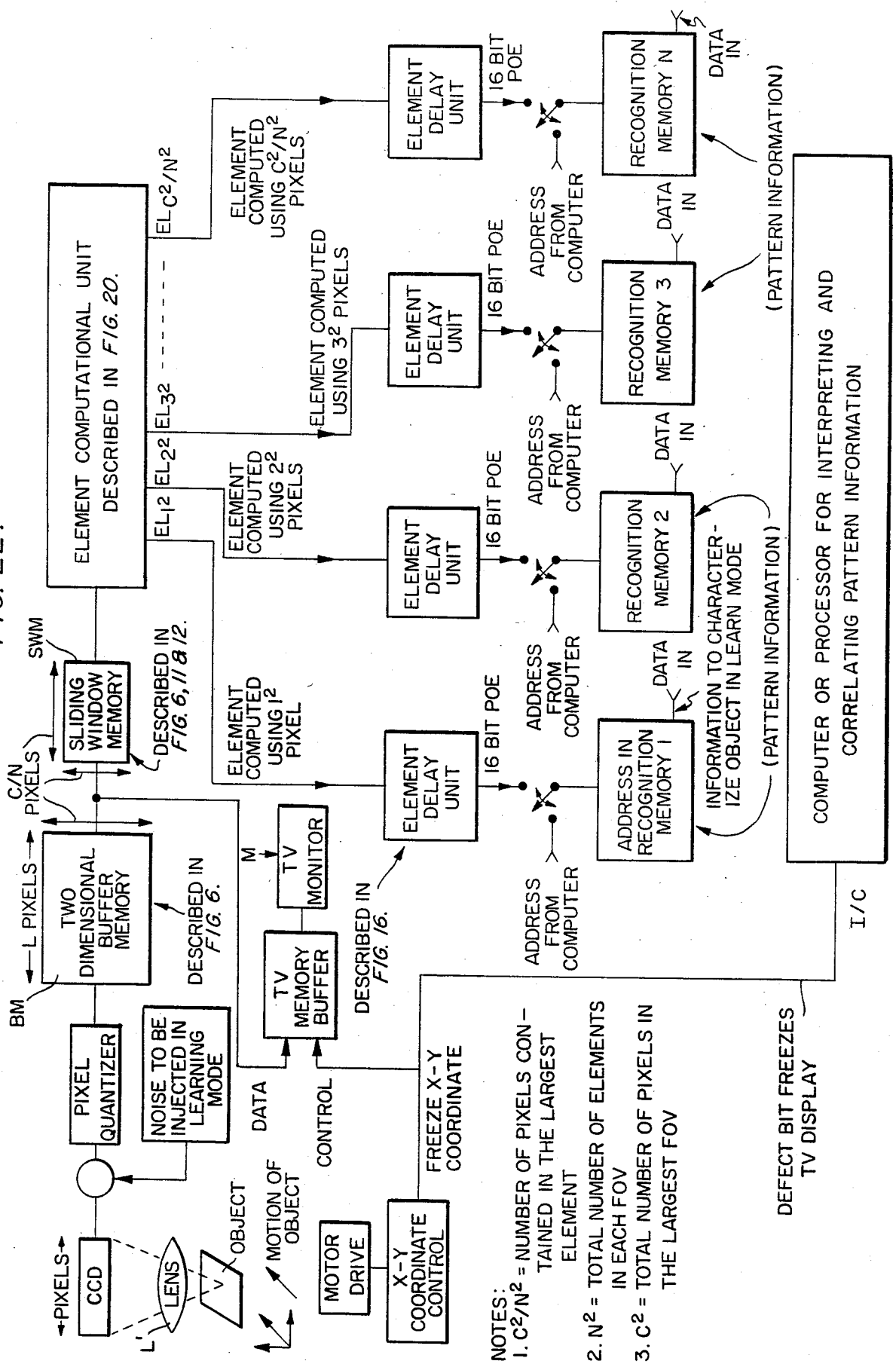

PROCESSOR FOR INTERPRETING AND CORRELATING PATTERN INFORMATION

METHOD OF AND APPARATUS FOR REAL-TIME HIGH-SPEED INSPECTION OF OBJECTS FOR IDENTIFYING OR RECOGNIZING KNOWN AND UNKNOWN PORTIONS THEREOF, INCLUDING DEFECTS AND THE LIKE

The present invention relates to methods of and apparatus for real-time high-speed inspection of objects for such purposes as identifying known and unknown portions thereof, pattern recognition, defect identification, and the like.

The art is replete with various types of pattern recognition and defect-monitoring schemes tending toward a fully automatic inspection system, such as those described, for example, in the Automatix Bulletin (Burlington, Mass.) 1981, describing the Autovision II programmable visual inspection system, wherein programmed information used in a computer identifies object areas, perimeters, major and minor axes, holes. Such systems, however, cannot identify defects that are small perturbations in the measured object, and require pre-programming and software control. Each new picture feature is measured and the image stored in memory in sequence and is then operated upon, which is time-consuming; and the system cannot treat with very high density or high complexity variations or very large size objects. Similar comments apply to systems such as the Model VS-100 Machine Visual System of Machine Intelligence Corp. of Mountain View, Calif., Mar. 10, 1980. The present invention totally eliminates the necessity for image storing; the data is analyzed and all information computed as each new picture element is scanned, with storage of learned attributes of the object only that are of importance. Other suggested approaches involve the use of masks, as in "An automatic optical printed circuit inspection system", by R. C. Restrick, SPLE Vol. 116, Solid State Imaging Devices 1977 (p. 76–81), wherein a mask has been used to characterize defects in scanning inspection systems with precalculated minimum line width criteria. The present invention does not require such pre-calculation or programming and looks at general shapes broadly and flexibly. Other mask systems ("A System For Automatic Visual Inspection of Printed Circuit Boards", D. Antonsson et al, Linkoping University Publication, 1979-01-16) look for spacing between lines and holes, also with pre-calculated and hard-wired and programmed criterea and also without flexibility for new and general problems and applications. In "A Process for Detecting Defects in Complicated Patterns" by Maskazu et al, Computer Graphics and Image Processing, 1973, Vol. 2 pp. 326–39, a different type of system is used that looks for small defects by enlarging and then contracting the image—again concepts not required in accordance with the present invention. The philosophical approaches underlying such and related techniques and the resulting complicated equipments and computer or microprocessor control programs operating in accordance with the same, have heretofore forbid a simple and universal approach to real-time high-speed object identification with facility for appliance to a wide variety of identification applications ranging from general pattern recognition to defect inspection and object or object portion identification for robotic control and the like.

An object of the present invention, accordingly, is to provide a new and improved method of and apparatus for real-time high-speed inspection of objects that are not subject to the above or other limitations and provide a universal approach to pattern recognition, defect identification and related problems.

A further object is to provide a novel high-speed automatic recognition and identification method and apparatus of more general utility, as well.

Other and further objects will be explained hereinafter, being more particularly delineated in the appended claims.

In summary, from one of its important aspects, the invention embraces a method of real-time high-speed inspection of objects with the aid of image sensors and the like, that comprises, generating signal images in the form of pixels of an object with such sensors at one or more magnifications; moving the object in a direction past the sensor; quantizing the pixels of the images into a minimum number of light levels or colors required to characterize the object; storing the quantized pixels to create a two-dimensional stored image equal to the largest desired field of view; selecting predetermined desired fields of view and magnification from said two-dimensional stored image; dividing each such selected field of view into $N^2$ elements; setting the brightness value of each element substantially equal to the average brightness value of the pixels contained within the element; quantizing each such element brightness value into a minimum number of threshold levels required to recognize patterns of interest; applying each $N^2$ quantized pixel group at each magnification as a pattern of elements to a corresponding recognition memory, with each pattern of elements serving as an address to said memory; entering information into accessed memory address locations in order to teach the properties of known objects and characteristics thereof; and thereafter recognizing previously taught information as to objects and their characteristics by reading information in each memory location accesssed by a pattern of elements and using each such information to characterize the object.

From another viewpoint, the invention involves a method of real-time inspection of objects at a predetermined region, comprising, optically scanning an area of interest of the object at said region; digitizing the scanned signals in real time to produce successive trains of digital signals corresponding to the optical scanned lines; delaying the successive trains of digital signals to produce a vertical raster of successive trains of digital signals corresponding to previously optically scanned lines; reducing the vertical raster to a sub-raster containing a predetermined number of substantially horizontal (H) and vertical (V) pixels; extracting from the sub-raster groups of pixels h by v in spatial distribution such that $v_i \leq V$ and $h_i \leq H$, where the subscript i represents the specific elements ranging from an element one pixel in size to an element V by H pixels in size; selecting an element threshhold value for each element size by predetermining a minimum and maximum number of pixels such that if the number of pixels contained in an element lies within said minimum and maximum values the element value is set to the value 0 or 1, with such thresholds varying with the size of the element; delaying each element by N, 2N, 3N, etc. horizontal pixels and by N, 2N, 3N, etc. vertical pixels to generate a mask representing a visual pattern wherein each element of the mask is displaced a full element from the previous or contiguous horizontal and vertical element; in a teaching mode, optically scanning a known object to generate a mask as above, serving as an address, and storing a code number at each address to teach the recognition of the desired object or pattern; when operating with an object to be inspected in run mode, reading the code number to determine if the mask generated during the optical scanning of the object-to-be-inspected corresponds thereto indicating the recognition of the desired object, or does not correspond thereto; and indicating if the object or pattern has not been previously seen.

From still a more general viewpoint, the invention also embraces a method of real-time high-speed inspection of objects with the aid of image-sensing scanning cameras and the like that comprises, storing digital signal mask information corresponding to video images of regions of predetermined fields of view of a known object at effectively different magnifications; successively scanning contiguous regions of an object with such a camera, for each of said predetermined fields of view, and digitizing the image scans to generate digital signal mask information; repeating such scanning at effectively greater magnification with the same field of view to generate magnified digital signal mask information; comparing the generated digital mask information at different magnifications with the stored digital mask information to identify known or unknown portions of the object; and indicating the identification of such known or unknown portions. Other features of the invention and preferred and best mode embodiments, including preferred apparatus and constructional details, are hereinafter presented.

The invention will now be described with reference to the accompanying drawings, FIG. 1 of which is an explanatory diagram illustrating orientation problems in inspection systems;

FIGS. 2, 3, 7 and 8 are plan views of illustrative defects in one of the important areas of application of the invention to printed circuit board inspection and the like;

Figure 6:
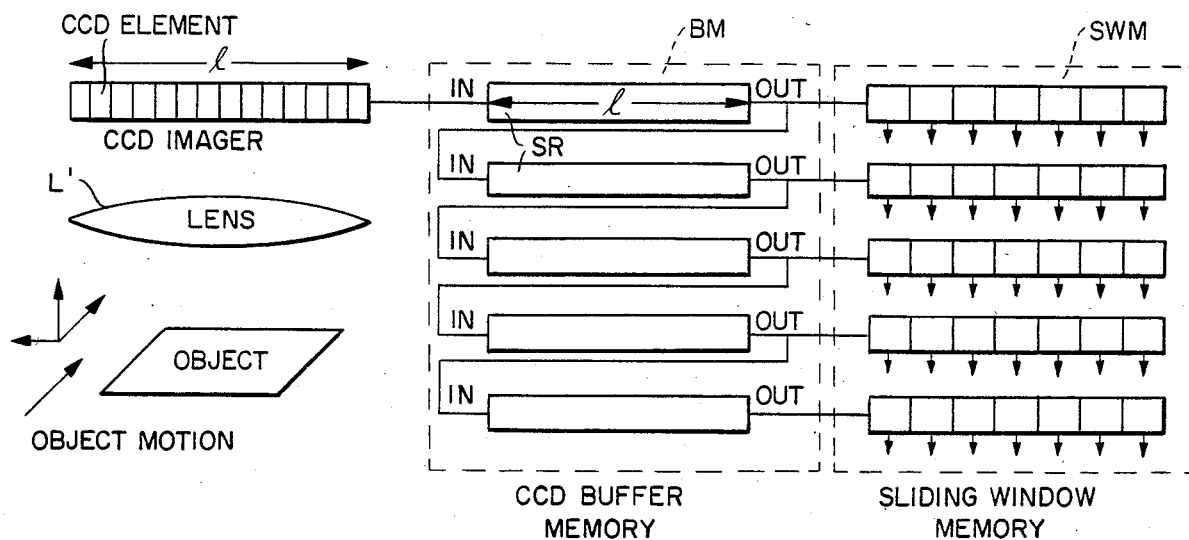
FIG. 6 is a block diagram illustrating memory apparatus useful in inspection apparatus constructed in accordance with the underlying philosophy of the invention.
Figure 8:
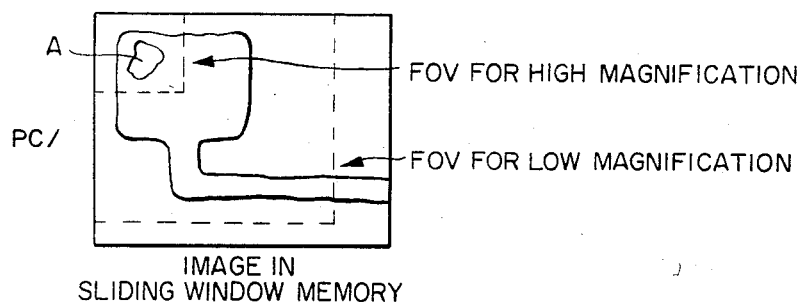
Figure 9:
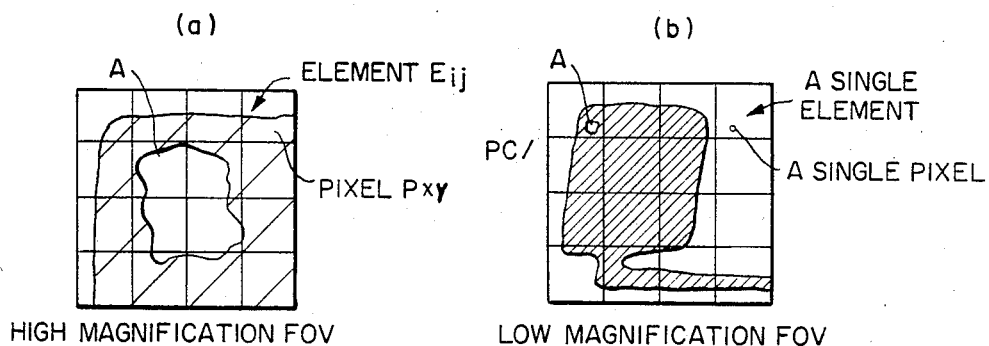
Figure 10:
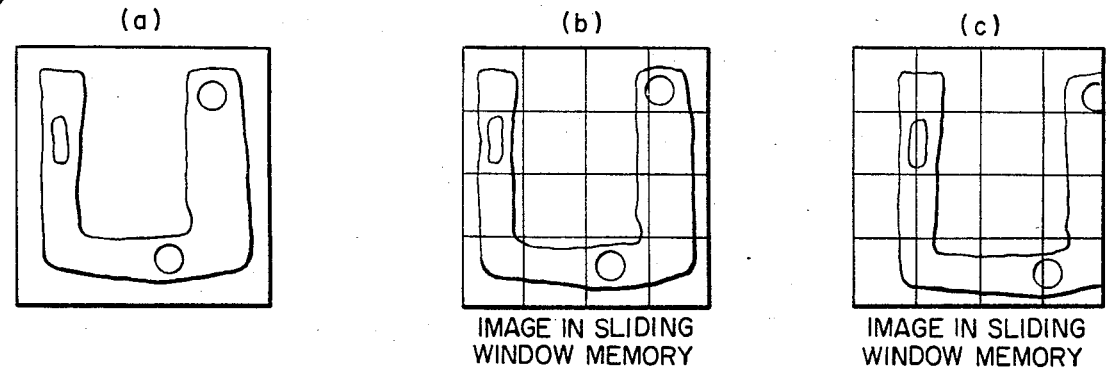
Figure 11:
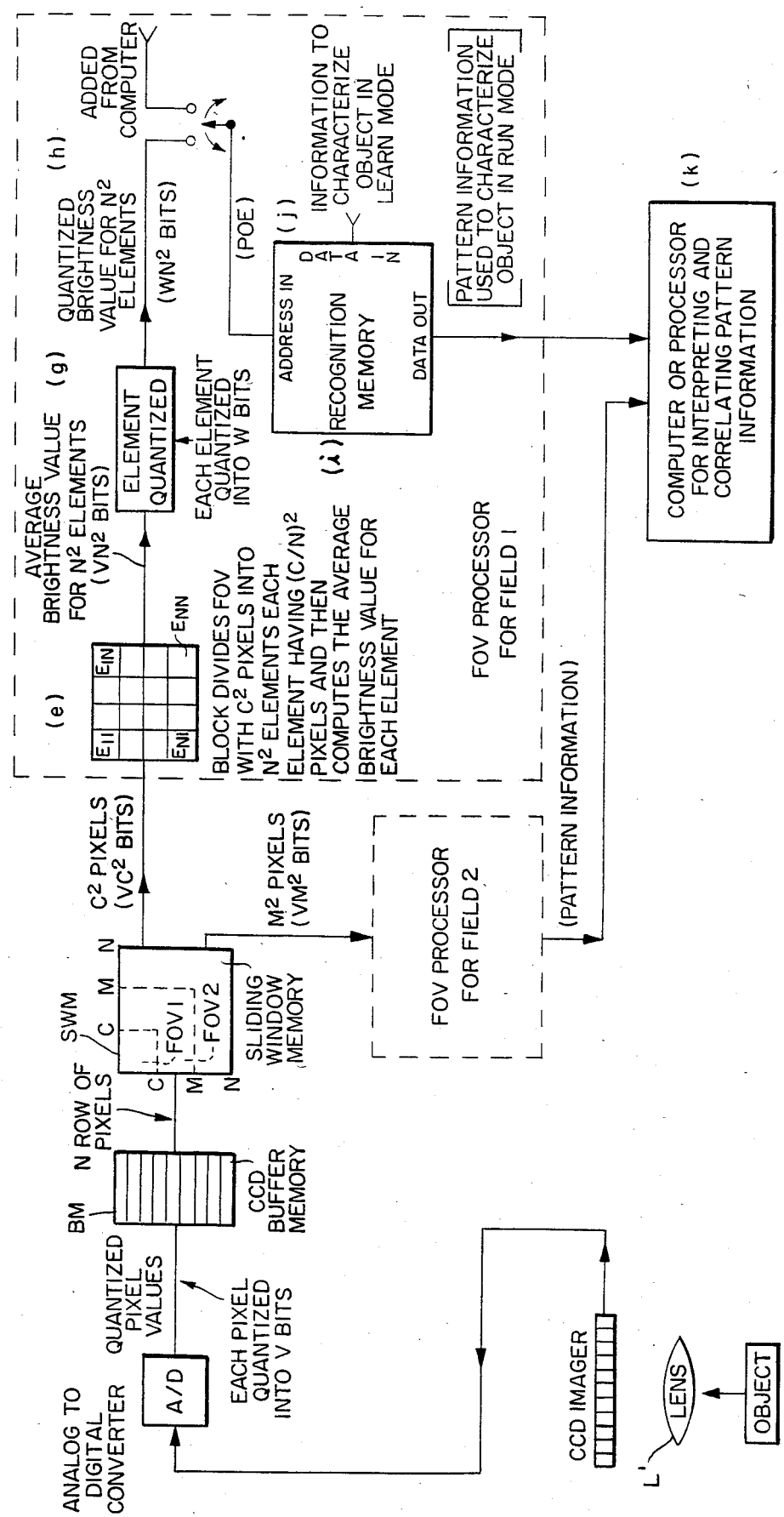
Figure 12:
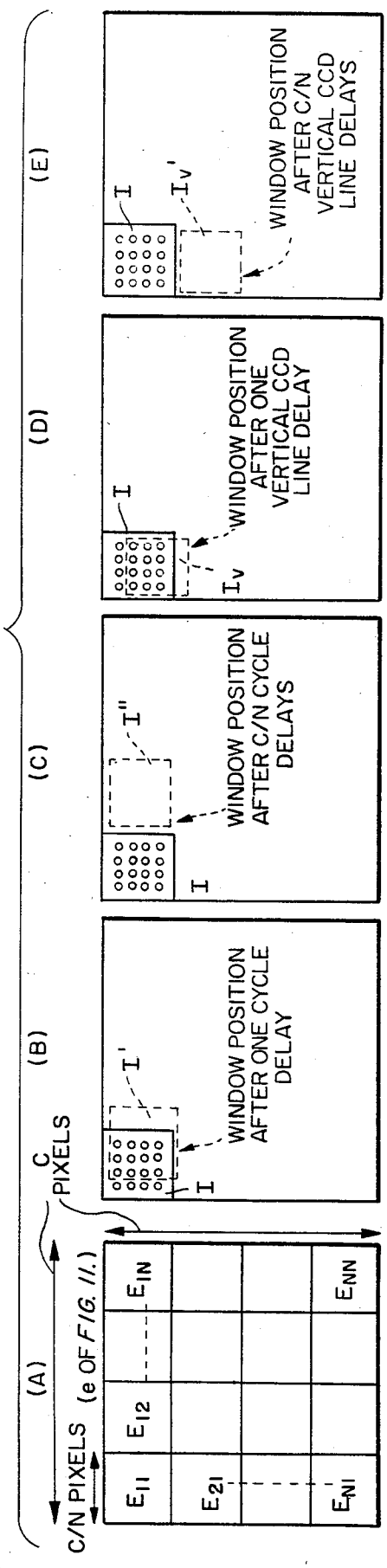
Figure 13:
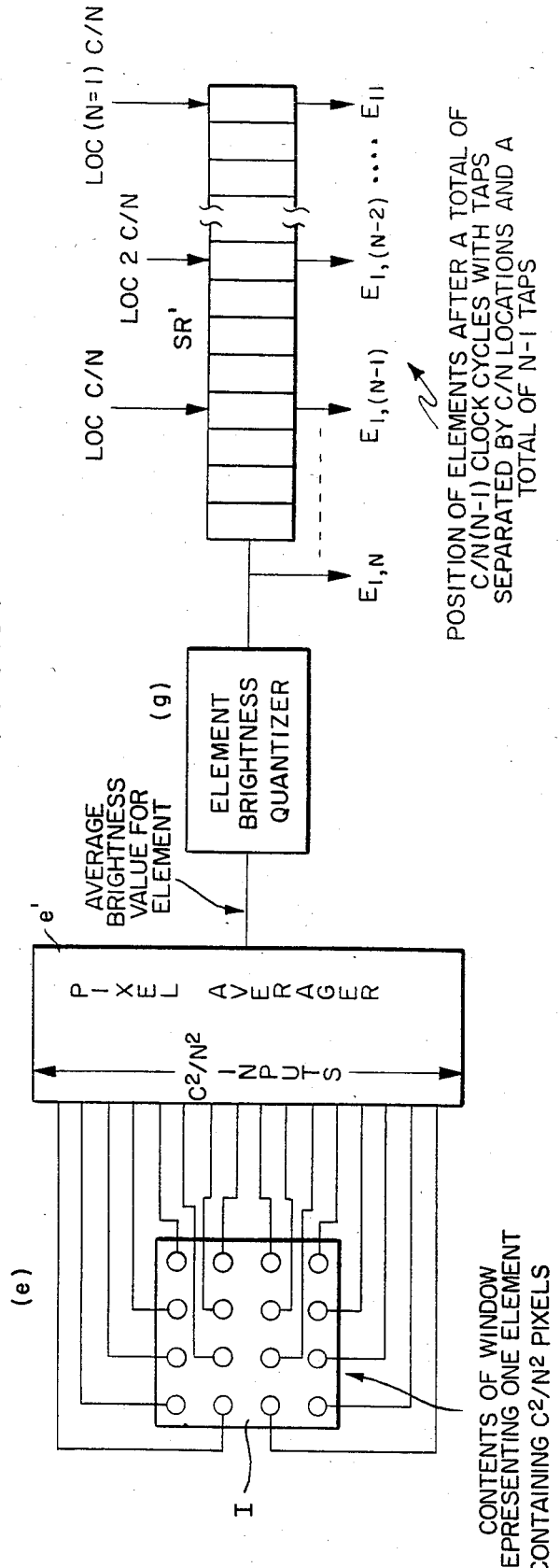
Figure 16:
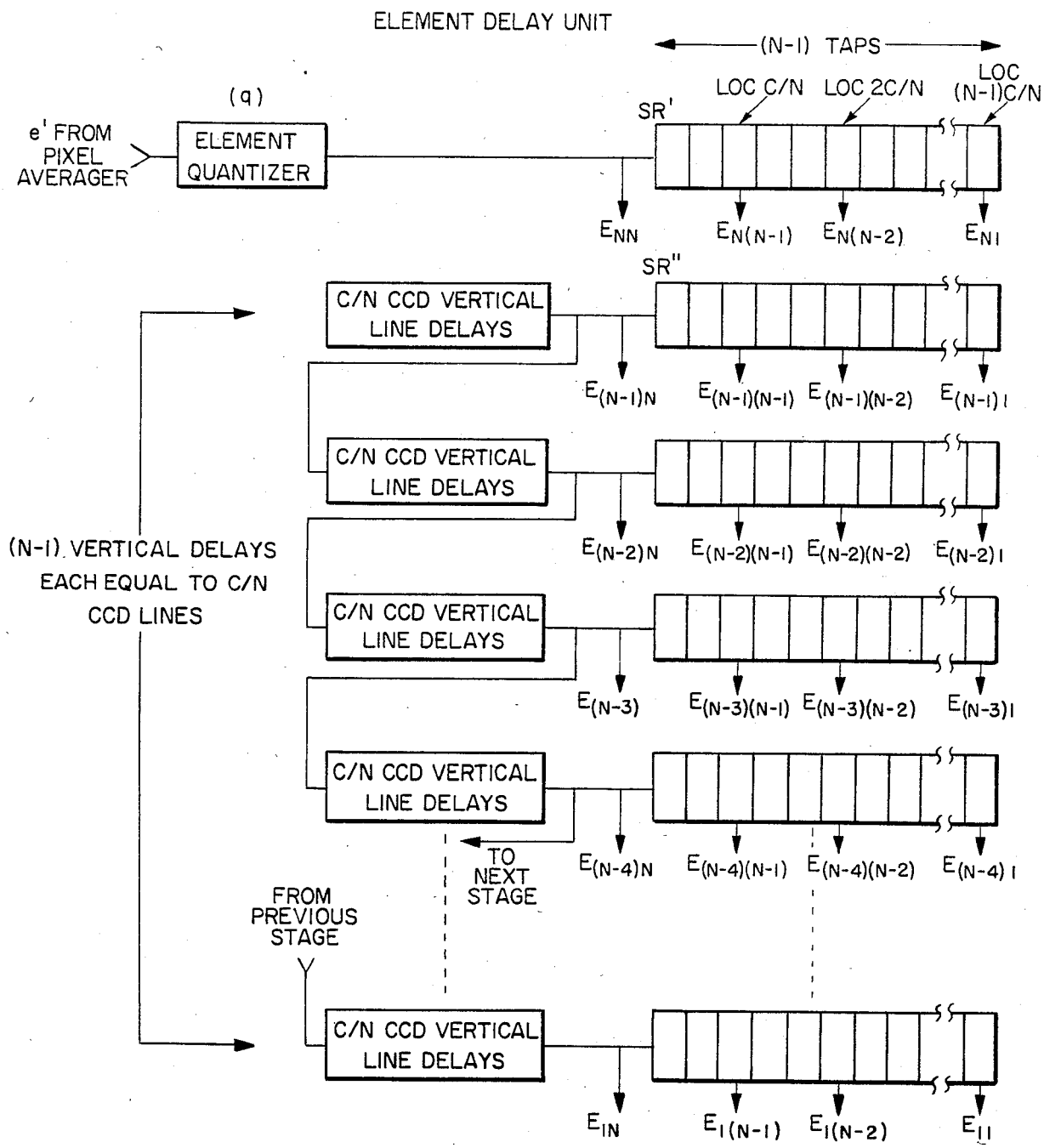
Figure 18:
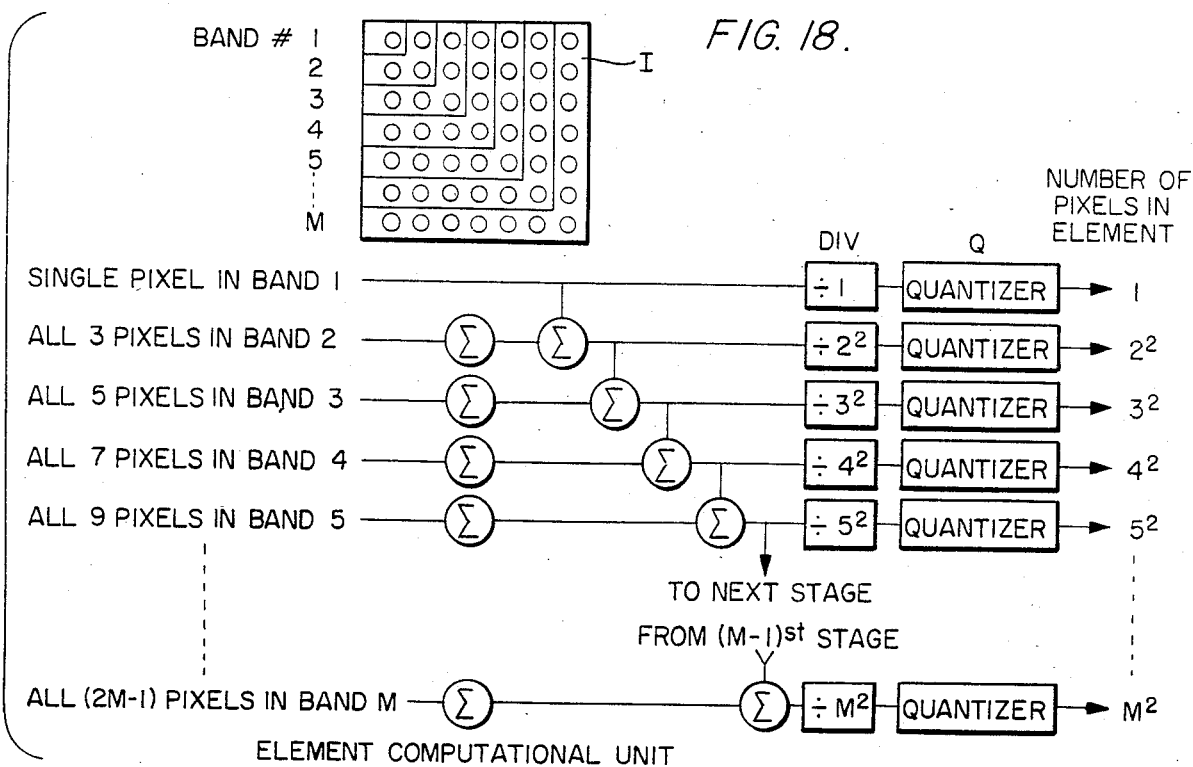
Figure 21:
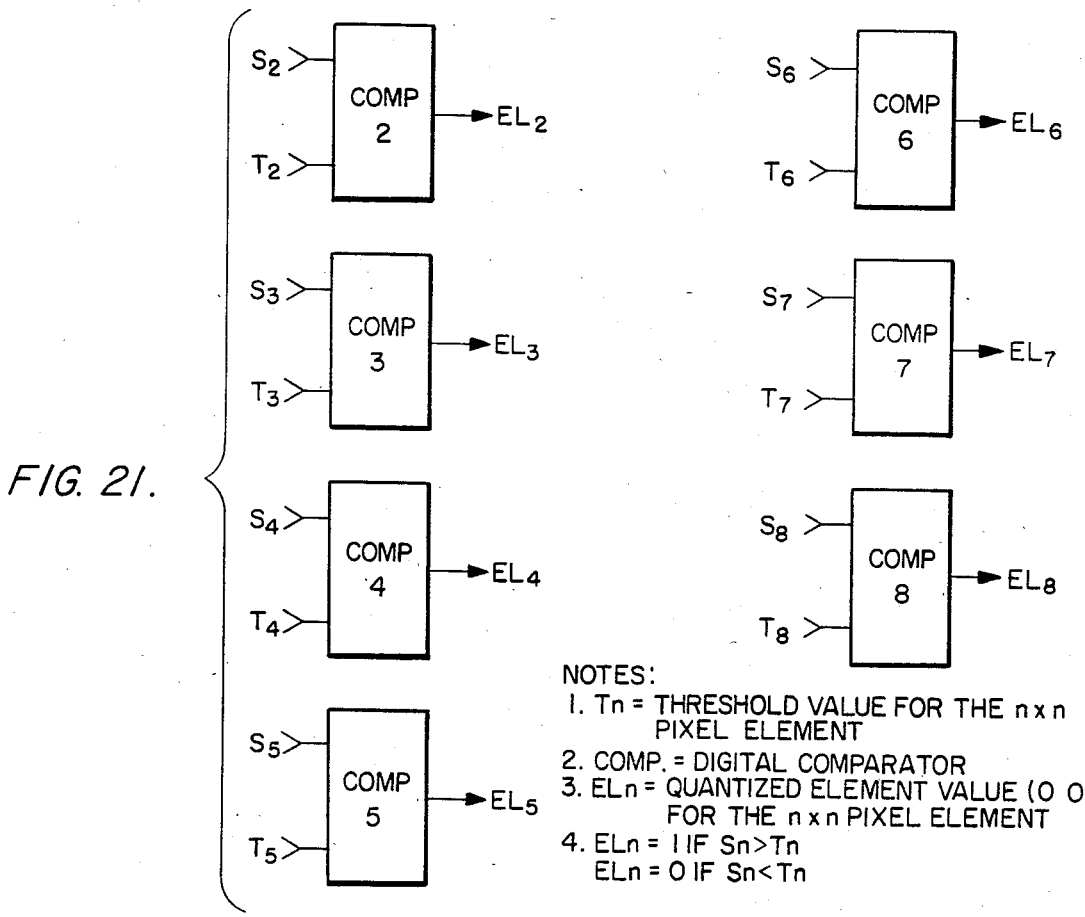

FIG. 9 contains views similar to FIG. 8 illustrating divided fields of view for inspection of defects at low and high magnification;

FIG. 10 is a similar view illustrating shifting positions of memory mask;

FIG. 11 is a combined block and functional diagram similar to FIG. 6 of the system functions of an inspection apparatus operating in accordance with the invention;

FIGS. 12 and 13 illustrate pixel groups being scanned and the analysis of the same at successive instants of time, more particularly outlined in the timing chart of FIG. 14;

FIGS. 15 and 16 are schematic block diagrams of scanned element quantization and delay registration in accordance with the invention;

FIGS. 17 and 18 schematically illustrate successive scanned bands of pixel groups and the quantizing of the same;

FIG. 19 is an alternate arrangement to FIGS. 17 and 18;

FIG. 20 is a more detailed diagram of the scanning window memory used in the system of FIGS. 11, 13 and 16;

FIG. 21 is a block diagram of the threshold comparators useful in the embodiment of FIG. 16;

FIG. 22 is a similar diagram of a preferred prototype implementation of the invention; and FIGS. 23(a)–(e) are block diagrams of parts of the inspection and correlating pattern information processer of FIG. 22.

Underlying the invention are certain procedural or philosophical approaches that are quite distinct from prior techniques and that are helpful to review for an understanding of the invention. For illustrative purposes, the problem of recognizing or identifying defects in an object, such as a printed circuit card or the like, will be referenced; it being understood, however, that the invention is clearly applicable to pattern or object identification in the general sense, as well. Such typical defects in, for example, printed circuit cards and the like are printed conductor breaks, pin holes, a neck or thinness in a conductor, and short circuits and the like. Many of these defects are microscopic in size.

The problem in this illustration may be to locate on the printed circuit card various size defects, including a defect that may require a fair degree of magnification before one can visually see the defect. From the heuristic standpoint, an observer attempting visual inspection may first scan the complete area, looking over small areas thereof to see if relatively large defects can be found, but without viewing the entire card in one glance; rather, concentrating on these smaller areas, section by section, and inspecting contiguous regions. To look for smaller defects, the observer may resort to the use of a magnifying glass. The field size as viewed by the eye will be the same as that viewed without the assistance of the magnifying glass; but now the observer will actually be looking at much smaller regions that have been magnified to some degree. With this greater magnification, inspection of contiguous regions will enable viewing any small defects, breaks, etc. The next step may be to inspect even smaller areas to identify even smaller defects, perhaps very fine pinholes, requiring an even more powerful magnifying glass for inspecting contiguous regions of interest, as before. The concept that in each case the field of view presented to the eye remains constant, but the amount of magnification and actual distances on the object have been blown up to fill the visual field of view, is an important concept within the context of the invention in preferred form.

Consider that a small field of view is made up of little picture elements, (pixels). These pixels are groups to create elements of binary value 1 or 0 and the elements are then grouped to create a mask. In this application, a mask 4×4 elements is created which can easily be mapped into a 65K dynamic or static memory. The technique for effectively varying the magnification to be provided to this mask resides in the use of picture point (or pixel) averaging, somewhat analagously to human viewing techniques. If one holds something very close, a lot of the details are apparent; but as one looks at an object farther away, one tends to average the fine picture points into one. In accordance with the invention, somewhat similarly, elements are formed by producing a kind of averaging or weighting function on a small group of picture elements or pixels with threshold averaged values selected such that the element value, 1 or 0, represents the averaged pixel brightness within the element area. For example, if an element is to be represented by a group of four pixels, 2 horizontal (h) by 2 vertical (v), it may be decided that if three of the four pixels are white (with common binary digits in the mask), the whole block will be considered as of white brightness; or if three are black, this may be the threshold for treating the block as black.

Thus, the threshold is set on a summing operation, and in real time, the final mask composed in this example of 4 by 4 elements is finalized with an averaging or weighted function of the pixels—such architecture lending itself to extremely high speed implementation. At a 5 megahertz data rate, as an illustration, the entire function composed of first forming all of the 16 elements and then deciding whether it is a "good" mask or a "defect" mask can be achieved. That determination can be made by storing "good" masks and comparing a real-time mask scan with the "good" masks to identify a defect. Alternatively, design masks for all defects may be stored, whereby mask matching would identify the defect. Since, moreover, the invention embraces looking at local features (perhaps a break or a pinhole), it is possible to use many inspection units simultaneously looking at the field in parallel. This may be somewhat analagous, from the human standpoint, to having several observers, each having a magnifying glass, simultaneously moving their magnifying glasses over different sections of the objects to be inspected. Because the field of view is adjusted such that a defect will fit inside the same, parallel processing units of this type could be employed, contiguous with one another, or overlapping and enabling inspections of very large fields in real time at very high speeds.

It is believed conducive to an understanding of the invention to treat first with the general philosophy underlying the inspection process thereof, involving certain frequent operations for recognizing objects and inspecting them for imperfections and/or characteristic identification marks in order to provide the sequencing framework for constructing an automated apparatus capable of performing such tasks at extremely high operating rates.

The methodology or architecture for implimenting such an apparatus from a systems standpoint will then be described in terms of a series of functions which can easily be performed by machine. The machine of the invention itself will then be delineated to illustrate exemplary implementation for performing the required functions in an efficient manner at very high operating rates, analyzing the entire object in real time such that this type of system is particularly well suited for production line inspection applications.

Turning first to the inspection philosophy underlying the invention, it is useful to consider the general ways in which a set of objects may differ from one another, such as differences in imprinted data or pattern, or the presence of a defect or other distinct characteristic. From an inspection standpoint, the same algorithm can be used to locate the pattern or defect that uniquely defines the object. For illustrative purposes, and because such is an important current application of interest, let us consider the use of the invention to inspect sets of printed circuit cards to detect imperfections such as cracks, holes or other surface irregularities. One may begin by first examining a single card at the highest optical magnification available, carefully looking for any noticeable faults while examining contiguous or overlapping fields of view (FOV) until a defect (or, in the more general case, a pattern of interest) is detected in one of the fields.

Figure 1:
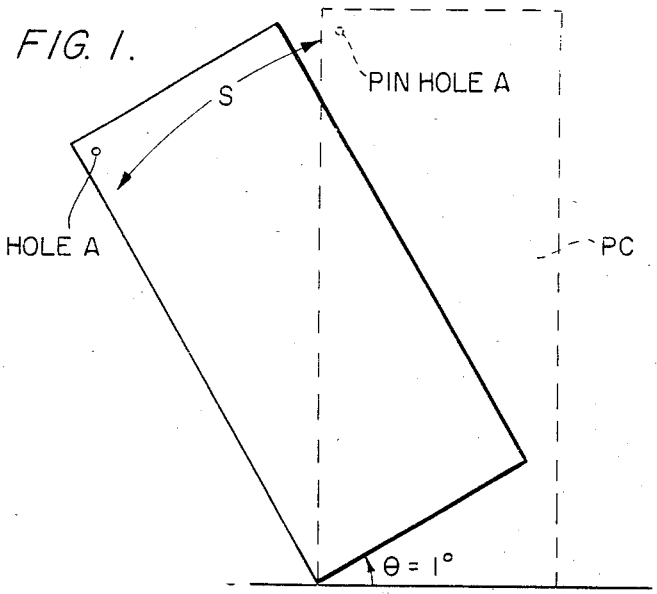

A most desirable feature of this recognition procedure, in accordance with the present invention, is to enable operation of the same with decreased sensitivity to angular rotation of the card or other object under inspection. Consider, for example, a printed circuit card PC that is, say, twelve inches long and six inches wide and that has a pinhole defect A with diameter 1/1000 inch (1 mil) located in the upper left corner, as identified in FIG. 1. If the PC card is tilted at an angle $\theta$, say one degree (illustrated in exaggeration in FIG. 1), this represents less than 0.3% of a circle, and such angular component of rotation would not be noticeable to a human inspector or observer. The linear component of displacement S, however, is given by $S = R\theta$ (in radians), such that for the illustrative R of 12,000 mils, S will be 200 mils, which is 200 times greater than the size of the hole A in this example. It is for this reason that prior art pattern matching recognition algorithms are not suitable for inspecting patterns that are small relative to the size of the object; though a human observer does not have this problem and would simply locate the defect at its rotated coordinates.

In human observer recognition, the person analyzes the contents of each field independently; and this quality is a feature that is also incorporated into the inspection philosophy of the present invention. Thus, a first operation that the inspection technique and apparatus of the invention performs is to:

1. Examine the contents of each field of view independently, searching for a pattern of interest that lies within the field.

Figure 2:
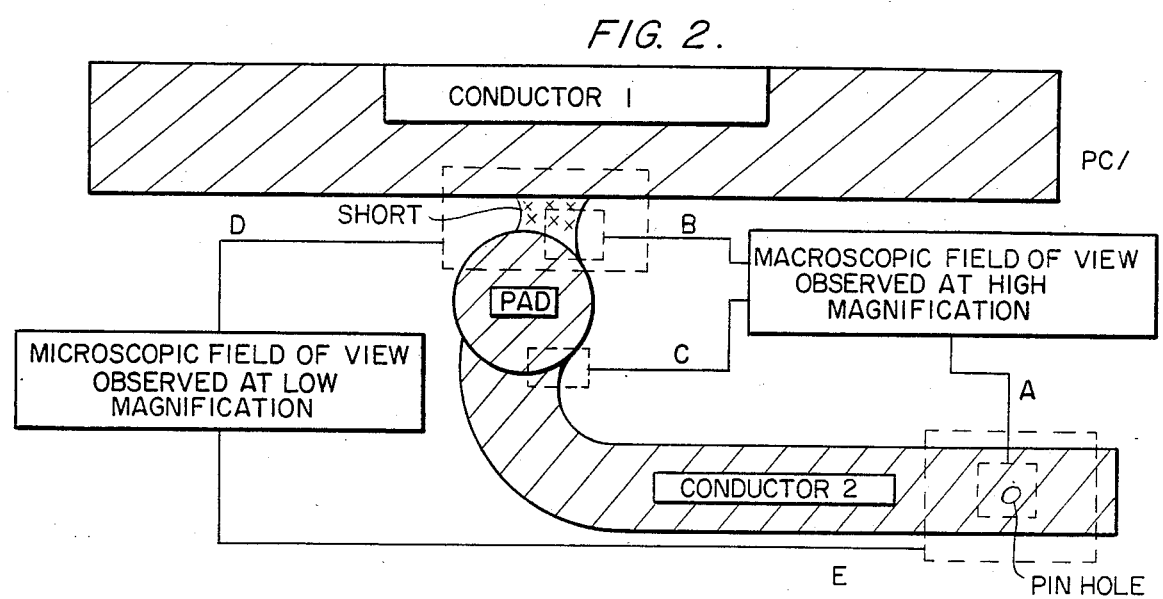
Figure 3:
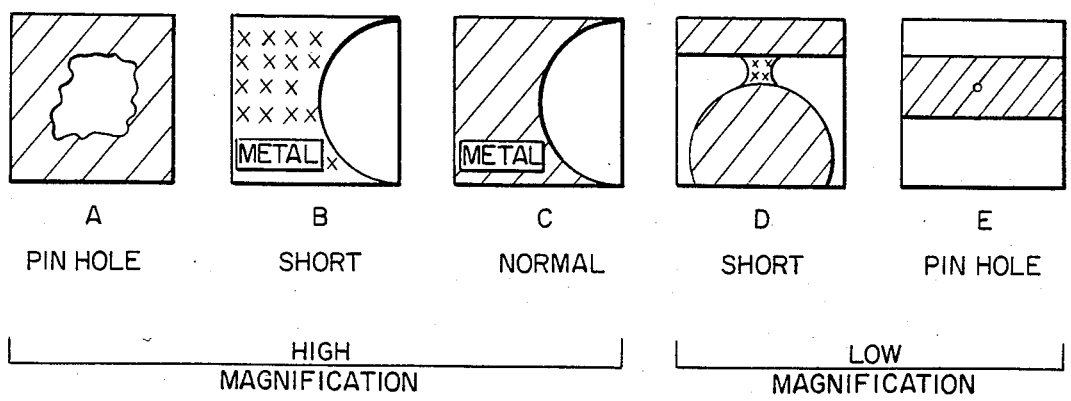

The pinhole type defect A illustrated in FIG. 1 is again shown at A in the lower right in FIG. 2, which illustrates also another type of frequent printed circuit card defect, namely a short-circuit metal connection B between a conductor 1 on the printed circuit card PC and a bonding pad, so-labelled, connected with a further conductor 2. FIG. 2 indicates that the pinhole and short defects A and B are to be observed both at relatively high and at relatively low magnification, as more particularly shown in FIG. 3. Portions A and B of FIG. 3 represent the appearance of the respective pinhole and short defects at high magnification (and as compared with a normal conductor edge at C), while portions D and E represent the same respective defects at low magnification. Certain larger defects cannot readily be observed within a given field of view at such high magnification; and it is thus frequently necessary to reexamine the object at lower magnifications. Consider, for example, the short defect B of FIGS. 2 and 3, in which the bonding pad has been shorted to conductor 1, tangent to the pad. With the high magnification field of view B, the short is indistinguishable from field C which shows a normal section of metalization joining conductor 2 to the pad. If, however, the magnification is reduced such that the entire short lies within the FOV, FIG. 3D, recognition of the short as such is greatly facilitated. FIG. 3E illustrates, on the other hand, that this low magnification, so suitable for large defect identification is not suitable to search for smaller defects such as the pinhole A. In the more general case, one may desire thus to examine an object at a variety of different magnifications. Thus, the automated inspection system of the invention will also:

2. Examine the entire object at a variety of different magnifications, analyzing each FOV as described in operation 1, above.

In other applications, it is advantageous to combine pattern information obtained at various magnifications to identify defects or other distinguishing characteristics. An illustration would be the case in which one must locate a break, for example, between a conductor and a bonding pad. One may first locate breaks at high magnification and then, without moving the circuit card, decrease the magnification to confirm presence of the pad and adjoining conductor. In this mode, identification of the pad-break-conductor configuration is obtained by correlating pattern information obtained at two different magnifications. The machine of the invention, to perform this recognition task, will thus:

3. Correlate pattern information obtained at different magnifications of the same object area to identify patterns of interest.

Unfortunately, there may exist certain large patterns or defects which will not lie within the FOV of the magnifying apparatus (such as a microscope) even under the lowest magnification provided. When this occurs, the invention provides for viewing contiguous or overlapping fields at this low magnification and constructing a complete picture equivalent to what would have been seen had a sufficiently low magnification objective been provided. For the machine of the invention to operate with this feature, it will, therefore:

4. View contiguous or overlapping fields and combine pattern information from each field to identify large patterns of interest.

It is important to recognize at this juncture, two distinct fields of view. One field is the area of the object viewed by, for example, the microscope objective. The other is the area of the microscope eye piece viewed by the eye, in the case of a human observer. The field of the objective is a variable which is a function of magnification; whereas, the field of the human eye is a constant. It is from this constant field that the brain obtains all its information, with the microscope serving to adjust the desired object image to fill the visual field. For this discussion it is advantageous to model the eye as a group of discrete visual receptors, such that contiguous image sections excite contiguous visual receptors. The human recognition system, the brain, then processes the data provided by these receptors and attempts to make a decision as to object or pattern identity.

In accordance with the automated recognition system of the invention, a somewhat similar mode is adopted wherein the system will:

5. Divide each optical field at each magnification into a constant number of picture elements ($N^2$) and present only these $N^2$ elements to a processing unit for recognition of the viewed pattern.

It should be noted, however, that the eye contains millions of receptors and the brain contains billions of memory locations. To construct and apparatus of this complexity would, of course, be extremely difficult and costly. A general practical system of this type of architecture, however, in which $N^2$ and the memory capacity has been reduced, is implemented in accordance with the invention, as later described.

In the general case where each picture element (pixel) responds to L different levels of light intensity or color, the total number of possible patterns P that can be imaged onto $N^2$ elements is given by:

$$P = L^{N^2}.$$

Consider, for example, illustrative numbers of $L = 256$ levels of intensity or color and $N^2 = 16$ elements. The resulting $P = 3.4 \times 10^{38}$ patterns is an absolutely enormous number to contend with. Fortunately though, when analyzing an image, the human recognition process is frequently preconditioned by a prior knowledge which can be used greatly to reduce the number of possible patterns. For example, when looking for printed circuit board defects one concerns oneself solely with the absence and presence of the conductive metalized traces. Variations in image intensity resulting from non-uniform illumination, light scatter and varying degrees of reflection due to oxide buildup and the like are totally ignored by the human observer; and the image is effectively quantized into two levels: one representing the presence of metal; and the other, representing its absence. In effect, thus, we have reduced L to two levels. Reconsidering the numbers of the above illustration, therefore, for $L = 2$ levels of intensity and $N^2 = 16$ elements, the number P becomes $6.5 \times 10^4$ patterns, a reduction of P by a factor of $5 \times 10^{33}$. The machine of the invention is thus constructed to adopt such efficient considerations and it will:

6. Use the minimum number of light levels or colors required to represent the object of interest.

From perhaps a more precise viewpoint, one actually wants to reduce the number of patterns P. If conditions exist where N can be reduced at the cost of increasing L, such that $P = L^{N^2}$ is thereby reduced, then this may be a preferable mode of efficiency In summary, therefore, the image acquisition function underlying the invention consists of the following three operations;

a. Obtaining images of the object at one or more magnifications;

b. Constructing these images using the minimum number of required light levels or colors; and c. Dividing each image at each magnification into $N^2$ discrete spatial elements.

The image recognition function of the invention, following such image acquisition, consists of performing any number or combination of the following four operations to locate patterns of interest:

a. Examining the $N^2$ elements from each field at each magnification independently, looking for a pattern of interest within each field;

b. Correlating patterns of the same object area generated at different magnifications;

c. Combining pattern information generated from contiguous or overlapping fields at a single magnification; and d. Performing recognition operation c at each of the different magnifications, and correlating the obtained pattern information.

It is now in order to examine the system methodology and functional description for implementing the invention.

The first system function that must be implemented is the acquisition of object images at different magnification. The simplest and perhaps most conceptual means to achieve this goal consists of placing a two-dimensional television, CCD, thermal-sensing, or other suitable sensing camera at the eye-piece of a microscope. In this mode, the object will be repeatedly scanned at each of the required magnifications. Such technique, however, has the inherent disadvantage of being relatively slow, since objects are viewed at each magnification in a sequential manner. Thus, the image acquisition time is proportional to the number of different magnification incorporated. In addition, if the object is moved at a rate faster than the readout time of the camera, the image will be blurred and distorted. This is frequently observed on home television sets, for example, when viewing a fast moving object as a baseball in flight. This blurring phenomenon is an additional factor which limits the maximum inspection rate.

Figure 4:
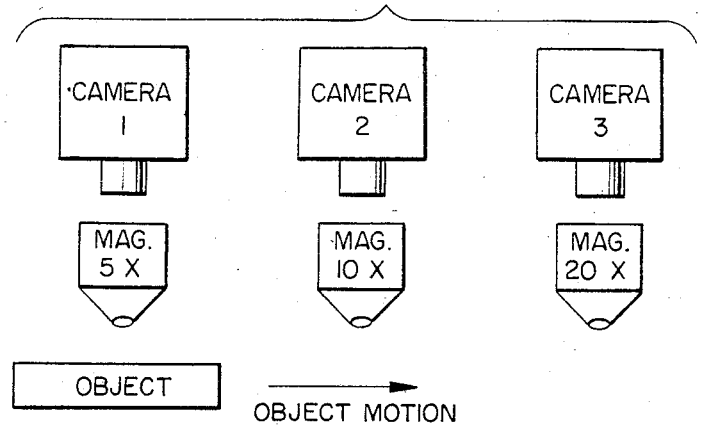
FIGS. 4 and 5 are similar diagramatic views of systems for imaging at different magnifications.
Figure 5:
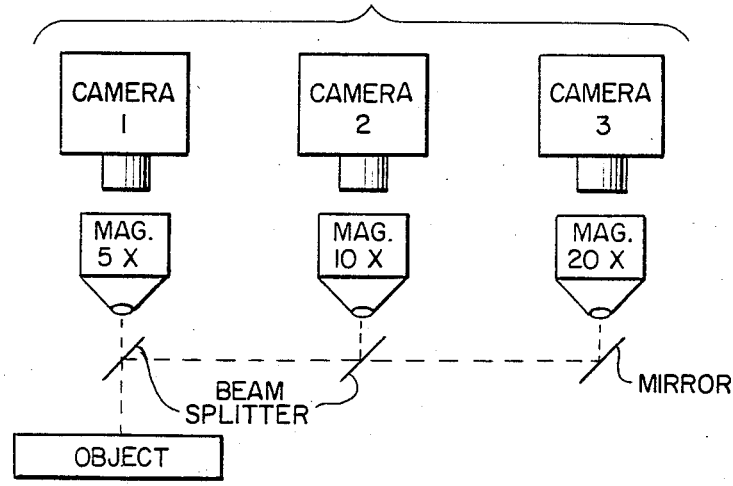

An alternative method, accordingly, is to obtain all images at each of the different magnifications in parallel. This can be achieved by having a separate camera for each different magnification as shown in FIG. 4, wherein camera 1 effectively operates at 5x magnification, camera 2 at 10x, and camera 3 at 20x, for example. The object, so labelled, would then be moved past each of the cameras, as shown by the arrow; or beam splitters and mirrors may be used, as in FIG. 5, to image the object onto each camera. This technique, however, has numerous disadvantages. It is costly and technically complex, requiring as many cameras as there are different magnification types; and critical optical alignment between cameras is required to maintain spatial relationships between patterns obtained at different magnifications. In addition, image blurring still occurs if the object is moved too fast.

A third method, and the one implemented in accordance with the preferred embodiment of the invention, utilizes a high resolution large field lens $L^1$, FIG. 6, (such as, for example the type Photor produced by Leitz, or APO-EL-Nikor produced by Nikon) to image the object onto a single high resolution linear charge coupled device imager (CCD) (such as, for example, the type 1728 pixel CCD currently produced by Reticon, or the type 2000 pixel CCD produced by Fairchild), shown at CCD in FIG. 6. The output of the CCD is then transferred into a two-dimensional buffer memory BM and then into a sliding window memory SWM to create large field high resolution images. This technique enables the resolution to be equal to that obtained from high magnification objectives, while the FOV is equal to or greater than that obtained from low magnification objectives. In addition, object blurring can be totally eliminated by moving the object perpendicularly to the axis of the CCD and reading out the CCD into the buffer memory BM each time the object image has moved a distance equal to one CCD element; which may be, for example, approximately 1/2000 of an inch. Specifically, the analog signal output of the CCD, after conversion to digital form by a conventional sampling pixel quantizer, so labelled, is transferred in FIG. 6 into the buffer memory BM which can be modelled as a series of shift registers SR each equal in length l to the number of CCD elements. The output (OUT) of each shift register SR is connected to the input (IN) of the next register and also to one row of the sliding window memory SWM, as shown in FIG. 6.

Figure 7:
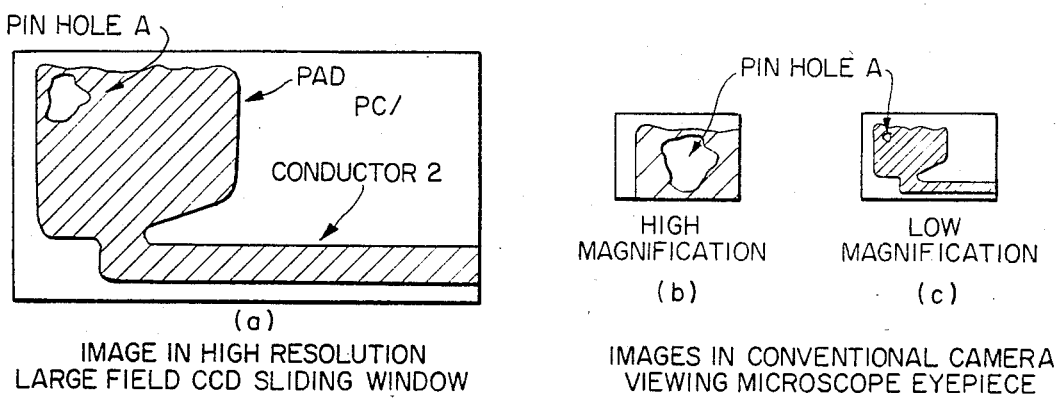

The image appearing in the window memory SWM is similar to what would be seen by moving a magnifying glass over the entire object, as schematically illustrated in FIG. 7, wherein (a) illustrates the resolution and FOV seen in the window memory SWM as compared to what is seen at (b) and (c), by a conventional camera viewing the eyepiece of a microscope at high and low magnification, respectively.

In addition, the optical configuration incorporated in the system of FIG. 6 is extremely flexible. The image size of the object produced on the CCD can be magnified or demagnified (from ½x to 3x using said Photor lens $L^1$; 2x to 10x or ½x to 1/10x using said APO-EL-Nikor lens) by simply moving the relative positions of the CCD, lens $L^1$ and object. Since the CCS is relatively very long (1728 pixels for said Reticon apparatus and 2000 pixels for said Fairchild equipment) and each pixel is extremely small (0.64 mils for Reticon, 0.5 mils for Fairchild), a large variety of high resolution large field images are obtainable.

It is not deemed practical to recognize patterns from this large field high resolution (LFHR) image directly, because the number of possible patterns is astronomical. If the image were divided into 32×32 pixels, for example, each represented by two levels of light, there could be as many as $10^{308}$ ($2^{322}$) possible patterns. Instead, in accordance with the invention, information is extracted from this LFHR image to simulate images at each of the different magnifications. Specifically, the following demagnification procedure is applied to the LFHS image to obtain the appropriate FOV's and resolution required to simulate all desired magnifications in parallel:

A. Select the FOV's that represent the desired magnifications.

An illustrative selection is shown in FIG. 8, corresponding to FIG. 7(a), for a high and low magnification objective.

B. Divide each FOV into $N^2$ (NXN) elements. For illustrative purposes, the respective high and low magnification fields of view of FIG. 8 are shown in FIG. 9 as divided into $N^2$ elements for $N^2=16$, at (a) and (b).

C. Set the brightness value of each element equal to the average brightness value of the pixels within the element.

In mathematical terms, if:

$E_{ij}$ = brightness value of the element in horizontal position i and vertical position j, $P_{xy}$ = brightness value of the pixel in horizontal position x and vertical position y, and N = total number of pixels contained within each element, then:

$$E_{ij} = 1/N \sum_{\substack{\text{all } X \\ \text{within} \\ \text{element} \\ E_{ij}}} \sum_{\substack{\text{all } y \\ \text{within} \\ \text{element} \\ E_{ij}}} P_{xy}.$$

If the brightness value of each element is quantized into one of 256 possible light levels, and there are 16 elements, then as many as $3.4 \times 10^{38}$ $(256)^{16}$ possible patterns could exist. Fortunately, however, in most applications, one can represent each element by considerably fewer light levels. In the case of the printed circuit card PC, for example, as few as two light levels can be used to recognize patterns of interest. Using two levels of light to represent brightness for each of 16 elements, yields 65,536 ($2^{16}$) possible patterns. In general, therefore, in accordance with the invention one would:

D. Quantize the brightness value of each element into the minimum number of light levels required to represent patterns of interest.

As a specific illustration, consider quantizing each element into two levels indicating the presence and absence of metal on the card PC. If, then, more than a given percent of the pixels within an element indicates the presence of metal, the entire element will indicate the presence of metal. In mathematical terms, let:

---

$P_{xy}$ = quantized brightness value of the pixel in the window memory at position x, y;
= 1 if metal is present on the card and
= 0 if the metal is absent on the card;
$E_{ij}$ = brightness value of element i, j;

= 1 if the element contains metal and
= 0 if the element does not contain metal; and
S = threshold value.
Then, $$E_{ij} = 1, \text{ if } S < \sum_{\text{all x within element } E_{ij}} \sum_{\text{all y within element } E_{ij}} P_{xy}; \text{ and}$$

= 0, otherwise.

This group of $N^2$ elements forms the actual patterns which are to be recognized and therefore will be referred to as a pattern of elements (POE). Each POE is applied to a recognition memory for positive identification. Each different magnification (or FOV) has its own recognition memory. In general, if each element is quantized into L discrete light levels and each POE contains $N^2$ elements, then there must exist $L^{N^2}$ memory locations, at each magnification, to store pattern information about each of the $L^{N^2}$ total possible patterns.

Since the mapping must be unique between each memory location and POE, the POE bit pattern itself is used in the invention as the memory address, and information about each particular POE is stored at that address.

The specific information is a function of the application and desired task. If that task is to locate defects on the printed circuit card as in the above illustration, and a defect is defined as any pattern not present on a good card, the memories are programmed as follows. A good card is scanned; and at each magnification, a valid bit is entered at each memory location accessed by a POE. This mode of operation is referred to as the "learn mode" because patterns are "learned" by the memories. To check cards, the system is now placed in "run mode." Each card is scanned and all POE are applied to the appropriate recognition memories for positive confirmation. Any foreign POE not previously learned is classified as a defect.

In other applications, one may require that a minimum number of foreign POE be present within a given spatial region before a defect is said to be present. It is important to note that when selecting the range of inspection magnifications, one must ensure that the highest magnification does not respond to normal surface variations in textural composition.

In still another application, one may desire to teach the machine to recognize different objects. An example useful in robotic and many other applications, is to teach the machine (learn mode) to differentiate among different tools, such as a plier, screwdriver, and hammer. One independently scans each of the three objects, assigning a different code number to each tool. If the plier is assigned code #1 and is scanned first, the number 1 is stored in each location accessed by a POE. If the screwdriver is scanned next and is assigned code #2, a number 2 is placed in each blank memory location accessed by a POE. If the location is not blank, but contains the number 1, this implies that the particular POE exists in both tools and the number 4 is stored in this location to indicate that the pattern is not unique. The hammer is now assigned #3 and scanned into the system. All accessed blank locations are programmed with the number 3. All accessed non-blank locations are programmed with the number 4. In run mode, a tool is scanned, and each memory address accessed by a POE is read. The frequency at which the numbers 1, 2 and 3 occur is computed. The object is identified by the number having the highest frequency of occurence that also exceeds some predetermined minimum value.

To ensure that the machine has been taught all POE's characterizing an object, it is essential that POE's be calculated after each new column of pixels is transferred from the CCD buffer memory BM into the window memory SWM (FIG. 6). This can be understood with the aid of the following example.

Consider a U-shaped object with three critically located mounting holes as shown in FIG. 10(a). To obtain the best resolution using the minimum number of elements, the field of view and element size shown in FIG. 10(b) is chosen. Notice, however, that one has been careful to place the object precisely in the center of the FOV (within the window memory). In reality, this condition will only exist at a given instant of time as the CCD is scanning the object. At another instant, the image may appear as shown in FIG. 10(c), shifted to the right. To insure that the machine recognizes the desired pattern of FIG. 10(b) and is also taught that the pattern of FIG. 10(c) may occur and is not a defect, POE's for both images must be taught to the machine.

Another application may involve teaching the machine to recognize a certain pattern for which there is no physical example. To teach this pattern to the machine, the correct recognition memories are first accessed directly via a memory input/output port. Identification numbers are programmed into the memory addresses that would be accessed by the POE's representing this specific pattern.

In run mode, the contents of all accessed memory locations are examined. When the contents equal the programmed identification numbers, the specific pattern has been located.

In summary, the methodology and machine functions necessary to implement the inspection apparatus are presented in the block diagram of FIG. 11, involving the following flow of functions:

a. Moving the object in a direction perpendicular to the axis of the CCD or other imager;
b. Quantizing pixels from the CCD output into the minimum number of light levels or colors required to characterize the object (A/D in FIG. 11);
c. Storing quantized pixels in a buffer to create a two-dimensional image equal to the largest desired field of view (BM in FIG. 11);
d. Choosing desired fields of view (FOV) and magnifications from the two-dimensional image (in SWM, FIG. 11);
e. Dividing each FOV into $N^2$ elements (block (e) of FOV PROCESSOR in FIG. 11);
f. Setting the brightness value of each element equal to the averge brightness value of the pixels contained within the element (see "AVG. BRIGHTNESS" output, FIG. 11);
g. Quantizing each element brightness value into the minimum number of levels required to recognize patterns of interest (block (g) of FOV PROCESSOR, FIG. 11);
h. Using each $N^2$ quantized pixel group referred to as a pattern of elements (POE), as the address to a recognition memory ("(h)", FIG. 11);
i. Using a different recognition memory for each different FOV (magnification) (FOV PROCESSORS for field 1 and field 2, FIG. 11);

j. Teaching the machine to recognize an object (learn mode) by computing POE's after each new column of CCD pixels is transferred into the sliding window memory and storing information characterizing each POE into the memory location accessed by the POE ("(j)" in FIG. 11); and k. Recognizing a previously taught object by computing POE's after each new column of CCD pixels is transferred into the sliding window memory, reading the information in each memory location accessed by a POE, and using this information to characterize the object ("(k)", FIG. 11).

While FIG. 11 is a block diagram that summarizes the system functions described above, to implement the final machine as in a practical high-speed, real-time, cost-effective system, these functions may be performed in a somewhat different order than indicated, as hereinafter explained.

Now turning to practical and preferred system implementation of the technique of the invention, it should be recognized that using the exact sequence of operations presented in FIG. 11 is extremely complex and costly though, if desired, it could be implemented. If, for example, the FOV extracted from the window memory SWM contains 32×32 (1024) pixels and the CCD is operated at a 5 megahertz data rate (200 nanosecond period), all 1024 pixels required to compute the POE for this field must be processed such that a new POE is generated each 200 nanoseconds (ns). Processing involves computing the average and quantized brightness values for each of the $N^2$ elements. In addition, this entire computation must be performed for each different FOV simultaneously extracted from the window memory SWM.

This complex operation can be greatly simplified by realizing that all the pixels required to compute the first of the $N^2$ elements (shown at $E_{11}$ at (e) in FIG. 11 and more fully delineated in FIG. 12(a)), is transferred from the CCD buffer BM into the window memory SWM prior to that required to compute the following element ($E_{12}$, FIG. 12(a), etc. up to element $E_{NN}$). One can therefore compute the element values in a temporally sequential manner, storing them until all $N^2$ elements have been computed and then apply them to the address lines of the recognition memories. By doing this, the window memory SWM need only be of sufficient size to store the number of pixels contained in the largest element, reducing the memory requirement of the window by a factor of $N^2$. Another advantage of this technique is that only one pixel averaging and quantizing unit is required to compute all element values, rather than $N^2$ units. The last and perhaps most important feature of this technique is that all $N^2$ element values required for each consecutive POE can be obtained in one clock cycle (200 ns) if the $N^2$ element values are stored in a tapped delay line memory. The details of implementing this architecture will now be described.

Consider a field of view containing $C^2$ pixels that is divided into $N^2$ elements as shown in FIG. 12(A) and at (e) in FIG. 11. Let the window memory be reduced in size such that it only contains those pixels being within a single element. This would correspond to a window memory capacity of $(C/N)^2$ pixels, where it is assumed that $(C/N)$ is an integer. The solid lines enclosing the circles in FIG. 12(B) are intended to represent the FOV of the window memory, forming rectangle I of FIG. 12, with the pixels represented by the group of circles. The first group of $(C/N)^2$ pixels that fills the window memory constitutes all the data required to compute element $E_{11}$ of FIG. 12(A).

The rectangle I of pixels (circles) is also shown in enlarged form in FIG. 13, showing details of the brightness averaging and quantizing functions (e) and (g) of FIG. 11, and which is to be now discussed in connection with successive times, as indicated on the timing chart of FIG. 14. If it be assumed that the window is in this position I at time $t_o$, FIG. 14, then, prior to the next clock cycle, time $t_1^-$, all $(C/N)^2$ pixels are transferred into a pixel averager $e^1$, as indicated in FIG. 13.

At the beginning of the next clock cycle (time $t_1^+$, FIG. 14), a new column of pixels is transferred into the window memory, effectively advancing the window position one column of pixels to the right, as indicated by the dashed square $I^1$ in FIG. 12(B). Prior to the beginning of the next clock cycle, time $t_2^-$(FIG. 14), the average value for element $E_{11}$ is transferred from the output of the averager unit $e^1$ (FIG. 13) into the element brightness quantizer (g). At the beginning of the next cycle, time $t_2^+$, the pixels in the dashed window $I^1$ are transferred into the averager $e^1$. Finally, after C/N clock cycles, the window memory contains those pixels required to calculate element value $E_{12}$ (FIG. 12(A)), as indicated by the dashed square $I''$ in FIG. 12(c). If one places the quantized element values into a shift register delay line memory $SR^1$ (FIG. 13), with N-1 taps separated by C/N locations, one can simultaneously obtain element values $E_{11}$ through $E_{1N}$. To obtain elements in the second through the $N^{th}$ row ($E_{21}$ through $E_{NN}$ in FIG. 12(A)), it is also necessary to delay values in the vertical direction ($I_v$, $I_v^1$, etc.). After a delay equal in length to one CCD line, the contents of the window will be that indicated at $I_v$ by FIG. 13(D). After a vertical delay equal to C/N CCD lines, the window memory will contain those pixels required to calculate element $E_{21}$, as shown at $I_v^1$ in FIG. 12(E). If one takes the output after C/N vertical CCD line delays and places it into a tapped delay line of the type described previously, shown at $SR''$ in FIG. 15, with taps for each C/N pixel location, one can obtain values for $E_{21}$ through $E_{2N}$.

Expanding this architecture to provide all values simultaneously for elements $E_{11}$ through $E_{NN}$, yields the general configuration shown in FIG. 16.

The greatest feature of the architecture is that it provides a window that moves in one pixel increments in both horizontal and vertical directions over the entire object. This ensures that all possible patterns of elements (POE's) are generated.

To implement a system that simultaneously views the object at different effective magnifications and fields of view, one must calculate elements of different size and delay these elements, as shown in FIG. 16, for each different magnification type. A general structure that provides element sizes ranging from one pixel per element to any number of pixels per element in which values for all the different element sizes are provided simultaneously, may now be described with the aid of the elementary diagram of FIG. 17, expanded in the computational unit diagram of FIG. 18. Considering first the three element sizes shown in FIG. 17, mask $I_1$, represents a 2×2 group of pixels; $I_2$, a 3×3 group; and $I_3$, a 4×4 group. If one has already computed the sum of pixel brightnesses within the 2×2 group $I_1$, and now wishes to compute this sum for the 3×3 group $I_2$, one only needs to compute the partial sum of pixel brightnesses contained within band 3 of FIG. 17, and add this partial sum to that computed for the 2×2 group $I_1$. Likewise, once the sum for the 3×3 group $I_2$ has been computed, one can compute the partial sum for band #4, add it to the sum for the 3×3 group $I_2$ and obtain the sum for the 4×4 group $I_3$. This process can be continued indefinitely. Such addition (represented by summing symbols $\Sigma$) is employed in the example of FIG. 18 later discussed.

For the system of the invention, one would first choose the maximum element size, say $M^2$ pixels. The partial summing procedure would then be incorporated to obtain all element sizes ranging from 1 to $M^2$ pixels as represented in FIG. 18. Alternative structures in which the elements are centered one within the other are shown schematically in FIG. 19; and other similar configurations can also be implemented in similar fashion. For the structure shown in FIG. 19, one would compute the sum of pixels within each rectangular ring instead of each "1" shaped band.

Returning to the example of FIG. 18, the computational time of the pixel averaging network is shown as a function of the total number of stages M, the number of bits per pixel, and the number of bits per quantized element, all of which can be optimized for a given application. A single pixel in band #1 is quantized to yield a result of one pixel in the element; all three pixels in band #2, divided by $2^2$ (DIV) and quantized (Q), yields $2^2$; and so on, with all $(2M-1)$ pixels in band #M, divided (DIV) by $M^2$ and quantized (Q), yielding $M^2$ pixels in the element. In addition, for certain applications, the stage of division (DIV) preceding the element quantizer (Q) in FIG. 18 can be eliminated, decreasing the computation time.

In the printed circuit card inspection example, as an illustration, it is feasible to quantize both the pixel and element brightness values into two levels indicating the presence and absence of metal, as previously described. For this application, M is chosen equal to 8, yielding elements ranging from 1 to 64 pixels in size. The computation time for all eight element values from the time the pixels are clocked into the 64 pixel window is 200 nanoseconds (ns). The sum of pixels brightnesses in each band of the window (see FIGS. 17 and 18) is calculated using high speed Look-up tables are formed (FIG. 20) in the form of programmable-read-only-memories (PROM's), now more fully discussed. In this application, each pixel brightness is represented by a logical "1" representing the presence of metal or a logic "0" representing the absence of metal, such that the sum of pixel brightnesses in a band equals the number of pixels in the band equal to a "1". This sum is computed by using the pixels in each band as the address to a PROM, FIG. 20, and storing as the contents of each address the number of bits equal to a "1" in that address.

Thus, in FIG. 20, the group of four pixels 11, 12, 21, 22 (corresponding to I, in FIG. 17 and band #2 in FIG. 18), is applied to the uppermost PROM (2), with the number of pixels in the 2×2 group $S_2$ equal to a logic "1" being $\leq 4$. Band #3 (3×3 pixels) is shown associated with the PROM (3) and band #4 (4×4 pixels), with PROM (4), and so on; with advantage taken of the computation of the partial sum of pixel brightness contained within band #3 by adding the same (11, 12, 13, 21, 22, 23, 31, 32, 33) to the pixel brightness for 14, 24, 34, 44, 43, 42, 41 at the high speed summing network $\Sigma_3$. In this example, $B_4$ (the number of pixels equal to a logic "1" in band #4) $\leq 7$.

As a further illustration, if the bit pattern in a band is given by 01011, this equals the binary address eleven. The contents of address eleven equal 3. The outputs of these PROMs, which equal the pixel sums in each band, are then summed together to form the final pixel sum for each element size. This final sum is computed using the high speed summing networks $\Sigma$ (FIGS. 18, 20). Each element value is then compared, as later explained in connection with FIG. 21, to a threshold number for the specific element size. If the value exceeds the threshold number, the element brightness is quantized to a logical "1", indicating the presence of metal. If the value equals or falls below threshold, the element brightness is quantized to a "0", indicating the absence of metal.

While FIG. 20 demonstrates how the pixel summing is implemented for all eight element sizes EL1 through EL8, FIG. 21 demonstrates how the thresholding is accomplished for the successive masks. The outputs $S_2-S_8$ are shown applied to respective comparators COMP 2-8, to which are respectively applied the appropriate threshold signals $T_2-T_8$. Each of the eight quantized element values EL1 through EL8 is applied to an element delay unit of the type shown, for example, in FIG. 16. A separate delay unit is required for each of the eight element sizes. Two parameters are required to implement the delay unit;

N=total number of elements along one axis of the FOV, such that $N^2$=total number of elements in the FOV which is equal to the number of elements in the POE applied to the recognition memory; and C/N=total number of pixels along one axis of an element.

The values for C/N are determined by the element size and are listed in Table 1 below.

TABLE 1

| Element Name | Element Size | C/N |
|---|---|---|
| EL 1 | 1 pixel | 1 |
| EL 2 | 4 pixels | 2 |
| EL 3 | 9 pixels | 3 |
| EL 4 | 16 pixels | 4 |
| EL 5 | 25 pixels | 5 |
| EL 6 | 36 pixels | 6 |
| EL 7 | 49 pixels | 7 |
| EL 8 | 64 pixels | 8 |

The value for $N^2$, which is the number of elements in the POE, also equals the number of bits applied to the address lines of the recognition memories ("k", FIG. 11), since each element value is represented by one bit in this particular application. The value chosen for $N^2$ is preferably selected to minimize cost and hardware complexity. Specifically, if there exists $N^2$ elements, each represented by two possible values ("0" or "1"), then there exists a total of $2^{N^2}$ possible patterns. This implies that the recognition memory (FIG. 11) must contain $2^{N^2}$ memory locations to store mask information about each pattern. The total number of integrated circuits (IC's) required to stores this information is given by the equation:

$$\text{number of IC's} = \frac{\text{total required memory}}{\text{memory/IC}}.$$

For this application, high speed static memories with read and write times on the order of 100 ns were required. The densest of such memories currently available contain 16,384 ($2^{14}$) locations with one data bit per location. The total number of these IC's required to store $2^{N^2}$ patterns with one bit of information used to describe each pattern is given by:

$$\text{number of IC's} = \frac{2^{N^2}}{2^{14}}.$$

Table 2 lists the number of IC's required as a function of the number of elements ($N^2$) in the POE.

TABLE 2

| Number of Elements in POE ($N^2$) | Total Number of Possible Patterns ($2^{N^2}$) | Number of IC's (16K memory) |
|---|---|---|
| $3^2$ (9) | $5.12 \times 10^2$ | 1 |
| $4^2$ (16) | $6.55 \times 10^4$ | 4 |
| $5^2$ (25) | $3.35 \times 10^7$ | 2,048 |
| $6^2$ (36) | $6.87 \times 10^{10}$ | 4,194,307 |

From Table 2 it is obvious that a 4×4 group of elements forming a total of 16 bits in the POE (i.e. $N^2 32\ 16$) is the maximum number of bits that is reasonable to implement, especially since a separate recognition memory is incorporated for each of the eight element sizes. In many applications, such as the one implemented herein, it is desirable to store more than one bit of information to characterize a given POE. Should this be the case, one can simply parallel memory chips. If, for example, numbers 0 through 7 (3 bits) need to be stored at each of 65,536 locations, this can be achieved by using 12 such memory chips.

It has been discovered that this learning process may be vastly improved in speed by proceeding in a way that prior communication or similar processing theory, predicated on reducing noise, has contra-indicated. Specifically, by deliberately introducing noise modeled to correspond to actual jitter or vibration of the inspection apparatus over time, or actual illumination variations over time, the learning time can be significantly reduced. "Noise" perturbates the relationship between the true signal and particular quantization levels that the signal lies between. To model such noise, we can either perturbate (or vary) the signal relative to the threshold (or quantization) levels, or perturbates the quantization levels relative to the signal. In this embodiment, the system uses one quantization level to create binary images (>threshold are white; <threshold are black), and the threshold is perturbated relative to the signal.

Referring to FIG. 22, for example, subsonic or low frequency noise modeled in spectrum and amplitude to be equivalent to vertical vibration noise of the inspection platform in actual operation over time, is introduced by adding the same to the analog image signals from the CCD, causing the same to be learned and thus recognized when detected, rather than eliminated. Large sample sets to be learned by standard practice is time consuming. By using the mask samples and modeling noise to correspond to vibration or variation in illumination (causing thicker or thinner lines in the imaging), and superimposing such noise at a rapid rate, on the analog image signals before being quantized to digital form the machine may be taught large quantities of information rapidly.

While this concept of thresholding noise introduction for teaching mask shifting or vibration and illumination variation effects is of more general applicability in analog signal-to-digital conversion than the apparatus of the invention, it is particularly useful herein. Noise in the range of 0.003 hz to 1 mhz has been so used, providing the following rather startling results.

In an exemplary system, the following frequency bands of noise were selected to effect graphic TV display, simulating the shifting of the object being examined (such as the printed circuit cards) either due to spatial offsets or vibration or possibly variations in illumination. Considering one horizontal bit, which in the example illustrated corresponds to a 2 megahertz data rate, the horizontal bands of noise frequencies were selected to affect one horizontal element at each of the eight different mask sizes P1-P8; that is, a single horizontal element may change value without affecting its neighboring elements. For the smallest mask (a single pixel), each one element, 1 megahertz; for P2 ($2^2$), 500 kilohertz; for P3, 333 kilohertz; for P4, 250 kilohertz; for P5, 200 kilohertz; for P6, 166 kilohertz; for P7, 140 kilohertz; and P8, 125 kilohertz. As for noise bands to satisfy vertical direction variations, P1, 1 kilohertz; P2, 500 hertz; P3, 333 hertz; P4, 250 hertz; P5, 200 hertz; P6, 166 hertz; P7, 140 hertz; P8, 125 hertz.

To vibrate the entire mask as a whole, as distinguished from just vibrating each element, as above, noise frequencies may be selected as follows: P1, 250 hertz; P2, 125 hertz; P3, 83 hertz; P4, 62 hertz; P5, 50 hertz; P6, 41 hertz; P7, 35 hertz; P8, 31 hertz. Effects such as slow daily variations in illuminations which would cause corresponding variations in camera signals, may be modeled by varying the threshold at a low noise frequency band in the range of 0.003 hertz to 15 hertz. This noise also simulates slow frequency wobble or possibly shaking of the entire machine and table thereof.

A further refinement that avoids the possibility of the apparatus mistaking an indicated abnormality for a defect or other such pattern of interest, as may be caused by variations about the thresholds, is the use of adjacent location mask outputs to enable the conclusion of a real defect, such as by monitoring horizontal and vertical contiguous masks. More generally, the avoidance of mask edge position uncertainty or error in the image of the successive samples being monitored during the line scanning of the object or pattern thereof, with resulting pattern uncertainty (including whether the defect or other sub-pattern of interest is actually there), is effected by monitoring adjacent or contiguous patterns in two dimensions (horizontally and vertically, for example), to verify that the same sub-pattern defect actually occurs in all adjacent masks. From one viewpoint, this may be considered also as effectively "vibrating" the mask to avoid uncertainty of image sampling. In practice, this may be effected by storing in succession the sets of bits representing horizontally adjacent pattern information in a scanned row or line of the image, as before explained, FIG. 23C, and comparing the same with similar pattern information of a vertically displaced adjacent scanned row line FIG. 23E; such that only if all pairs of pattern information sets of bits show the presence of the sub-pattern, is indication of the detection of the defect or other sub-pattern indicated.

As previously described, masks are composed of elements, and elements are composed of groups of pixels ranging from 1 pixel in size to many pixels. A pixel's threshold is set, and if the number of white pixels contained within an element group exceeds the minimum threshold, the element is said to be white; else it is black. In the larger elements which contain many pixels, thresholds may be set, for example, such that if more than 50% of the pixels are white, the element is white. Elements lying on edge boundaries, however, may oscillate in value because there exists a certain amount of quantization error or noise in the system. Following inspection during the learning phase, where an element may have been determined to be white because 50% of the pixels showed white, should 1 pixel change its value during the run phase, a new pattern may be generated, not previously seen during the learn mode; and hence this unknown or foreign pattern will be flagged as a "defect". Such variations due to quantization of edge elements or noise can lead to false error detection which, in accordance with a feature of the invention, is obviated by effectively "vibrating" the mask in spatial coordinates, both horizontally and vertically, at least 1 pixel. If a true defect is to be detected as such, the foreign or unknown pattern must be detected within plus or minus a predetermined number of pixels in both horizontal and vertical directions. In other words, the defect must be present at all "vibrational" positions of the mask; otherwise, it is concluded that the defect signal resulted from such quantization and should be ignored as such as not constituting a true defect.

The invention thus provides a significant departure from prior pre-programming concepts in image inspection and recognition systems, enabling self- or auto-learning, wherein the objects to be "learned" are placed underneath the system which proceeds to scan them, learning all important features thereof as the complete learning process. No programming whatsoever is needed. The invention further eliminates any requirement of critical alignment, and operates independently of slight rotation or displacement of the object. In addition, the invention enables orienting the object by rotating it while "learning", thus to reach the system all possible orientations and thus render the same orientation independent. Specifically, one should be able to vary the rotation by 360° divided by 4N, where N is the number of pixels on one side of the sliding window memory, without any major variation. Through learning the noise-modeling and effective mask "vibration" techniques, moreover, the system additionally becomes almost completely uneffected by any vertical or horizontal shifts whatsoever.

While the specific illustrative embodiments of the invention have been described with reference to elements composed of contiguous elements, such need not be contiguous. The elements may be composed of every n data points or other sub-samples of data points, or sub-sample groups of data points (for example, groups of four pixels at a time, with each group spaced by ten or twenty pixels apart). This would model in accordance with a kind of averaging or sub-sampling scheme. It should further be noted that the mask does not have to be of square configuration as illustrated. It could be triangular or round or circular or of any other kind of two-dimensional shape whatsoever, so long as the masks can be overlapping such that all areas of the object are seen by the masks, independently of the mask shape.

An additional feature of the invention is that since the same processes all data as it is being scanned, with complete information and decision-making performed as the data is coming in, there is no necessity for storing the picture whatsoever. The implication of this feature is that the system can look at extremely larger fields—in fact, at truly infinite fields, without limitation. For example, the system can look at a row of printed paper or newspaper coming out in thousands and thousands of feet, analyzing it as it passes. It can inspect rolls of metal, as for pin holes or other artifacts, with no limitation on size. This is as decidedly contrasted with prior systems that require that the image be stored, storage size increasing as the square of the image, to astronomical values in such applications as the newspaper or the like, before mentioned.

In summary, moreover, the architecture underlying two modes of implementation of the invention are as follows:

First, the system having stored scan information on a known object, scans similar objects-to-be inspected and determines if any shape not previously seen is present, and, if desired, stopping or otherwise indicating the location, for example, of defects or shape variations not present in "good" object images.

In a second mode of operation, the system is "taught", as before explained, to differentiate between different types of objects by storing scan information as to these different objects with information for uniquely defining the different objects, and then, when inspecting objects, as in a bin or on a conveyor belt, identifying the same and, if desired, stopping and/or tagging the identified objects.

Those modes can, of course, be expanded into a very general concept of character recognition by causing the machine to scan the various letters of the alphabet as different objects and storing and tagging the scan information of the different letters for totally unique characteristics. In the English alphabet, for example, there are 26 characters, such that each of the characters may be associated with respective tags 1 through 26. Of course, because the technique "looks" at general shapes, there is nothing that limits the characteristic process to any one alphabet or language or symbols.

While sometimes inspection is required at only one magnification, at other times the before-described repetition of scanning at different magnifications is essential. The concept underlying the invention is to provide a set of magnifications, the smallest being chosen, as previously explained, to see the smallest object of interest such as a defect or other shape, and to use the largest magnification which will still show perhaps the largest object and still enable identification of that object. By storing pattern information at the lower magnification as well as the higher magnification, patterns can be recognized at very fast rates, say 200 nanosecond-type speeds or less. This will reduce and perhaps in some applications eliminate the need to reconstruct the larger shapes or perimeters from the smallest shapes shown by the highest magnifications.

The invention thus distinguishes also from some other approaches that store specific "learned" images and cannot work with new images not seen before. In accordance with the invention, to the contrary, the system learns and stores in recognition memory graphical characteristics which it can then identify when such appear even in totally new graphics and images that have not been shown to the machine before. Of course, graphical characteristics are not the only information that may be classified in accordance with the underlying concepts of the invention; the same being applicable to other information including other electromagnetic or acoustic signal information, if desired.

Referring to the system of FIG. 22, illustrative of a practical embodiment of the invention, an object is in motion (as upon a moving table or platform or the like)

past the inspection station in the upper left, illuminated so that its image is focused by a lens L' upon a linear CCD or other sensing camera or the like, with the object motion perpendicular to the CCD. The output of the CCD is an analog signal which is quantized into the 5 digital levels. The quantized information is stored in a two-dimensional buffer memory BM, each line of the buffer memory being equal to the length of the CCD scan, such that a large two-dimensional image is created. From this large two-dimensional buffer memory, a small memory, referred to as a sliding window memory SWM, is filled, in effect sliding along the large two-dimensional buffer memory. The size of the sliding window memory is equal to the largest element size required to compute the largest mask. The information from this sliding window memory is placed into an element computational unit. The sliding window memory contains ($C^2/N^2$) pixels, where $N^2$ is the total number of elements looked at in each field of view, and $C^2$ is the total number of pixels in the largest field of view. In this specific application, the largest element size is 8 pixels by 8 pixels, or a total of 64 pixels. From the output of the element computational unit FIG. 18, an actual mask, 4 elements by 4 elements, is created. The specifics of the elment delay unit which computes these masks was earlier described in connection with FIG. 16, and the output of each of the element delay units is fed to a recognition memory. For each different size, there is a unique element delay unit that creates the mask composed of such elements, referred to as POE (pattern of elements), and such are traced onto the address lines of the recognition memory, representing a unique address or unique pattern.

During the learning mode of the system, an object is shown to the machine and scanned, developing these patterns of elements or addresses applied to the recognition memory, such that information about these patterns is stored as associated with the specific object being scanned. In the run mode of the apparatus, inspecting an object under test and determining whether that object has been seen before and "learned", the patterns of elements or addresses of the object under inspection that are developed are compared with the contents of the recognition memories to determine whether these patterns have been seen before. The analysis for actual interpretation and correlation of these patterns is performed in a unit described as a computer or processor for interpreting and correlating pattern information, performing the following operations, First, if any pattern is developed at any of the different recognition memories that has not been previously seen or learned and addressed therein, this constitutes an error or defect or pattern outside the norm, and is flagged. For this to be definitely identified as a true defect, it may be required, as before explained, that multiple recognition memories all indicate a foreign pattern is present at more than one of the so-called view magnifications; or, if only certain recognition memories for the given application are important, that a certain limited number of foreign patterns would constitute a defect. In another mode, as before outlined, due to pixel quantization errors, a single indication of a defect at a single location on the object is not sufficient to determine that the defect is actually present; but a check is effected around a given region of the object, as by requiring at least two contiguous horizontal and vertical locations all to flag the presence of the defect. Thus the outputs of these recognition memories are viewed continuously in real time as the object is being scanned, with the information as to whether these patterns have been previously seen or not during the learning mode, being continuously monitored by the processing and interpretation and correlation unit, flagging errors if present. It is important to note that the architecture of this technique permits the performing of these correlations at very high speeds and with relative simplicity.

Summarizing the operation of FIG. 22, thus, the optical scanning of an area of a region of interest of the object is performed by the CCD. Digitizing the scanned signals in real time to produce successive trains of digital signals corresponding to the optical scanned lines, is performed in the pixel quantizer. Delaying the successive trains of digital signals to produce a vertical raster of successive trains of digital signals corresponding to previously optical scanned lines is effected in the two-dimensional buffer memory, more fully previously described in connection with FIG. 6. The sliding window memory SWM thereupon reduces the vertical raster to a sub-raster containing a predetermined number of horizontal H and vertical V pixels, earlier described in detail in FIGS. 6, 12 and 13. Groups of pixels are now extracted from the sub-raster groups of pixels in spatial distribution such that $V_i$ is equal to or less than V and hi is equal to or less than H, where the subscript $i$ represents specific elements ranging from an element one pixel in size to an element V by H pixels in size, reference being made to the element computational unit described in FIGS. 18, 20 and 21. That unit enables selecting an element threshold value for each element size by predetermining a minimum and maximum number of pixels, such that if the number of pixels contained in an element is within said minimum and maximum values, the element value is set to the value zero or one, with such threshold varying with the size of the element, as detailed in FIG. 21. The element delay unit (more fully described in connection with FIG. 16) delays each element by N, 2N, 3N etc. horizontal pixels and by N, 2N, 3N, etc. vertical pixels to generate a mask representing a visual pattern wherein each element of the mask is displayed a full element from the previous or contiguous horizontal or vertical element. By optically scanning a known object, a mask is generated as above to serve as an address and a code number is stored in the recognition memory of FIG. 22, such address indicating the teaching of the machine to recognize a desired object or pattern. When operating in a run mode with an object to be inspected, the code number is read to determine if the mask generated during the optical scanning of the object to be inspected corresponds thereto, indicating the recognition of the desired object pattern or the lack of correspondence thereto in the computer or processor for interpreting and correlating pattern information (FIG. 22). If the object or pattern has not been previously seen, such is indicated or flagged.

Figure 23A:
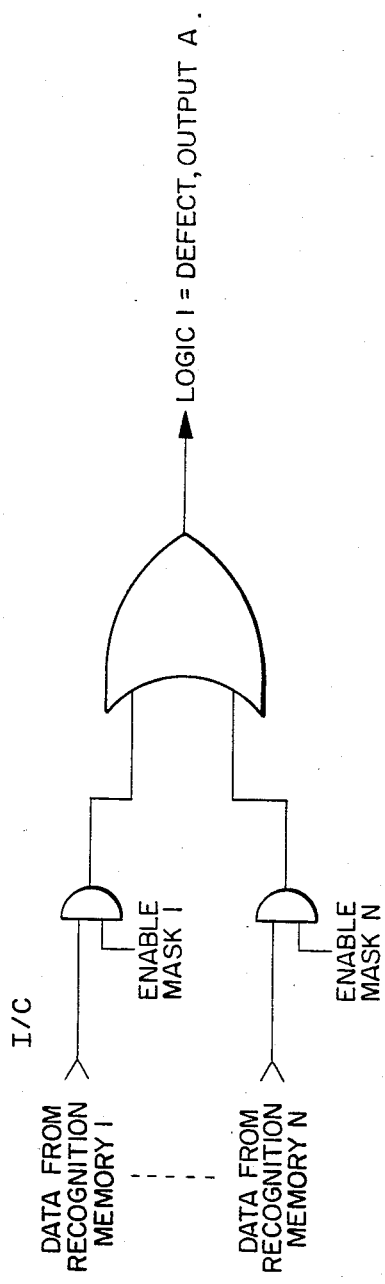
Figure 23B:
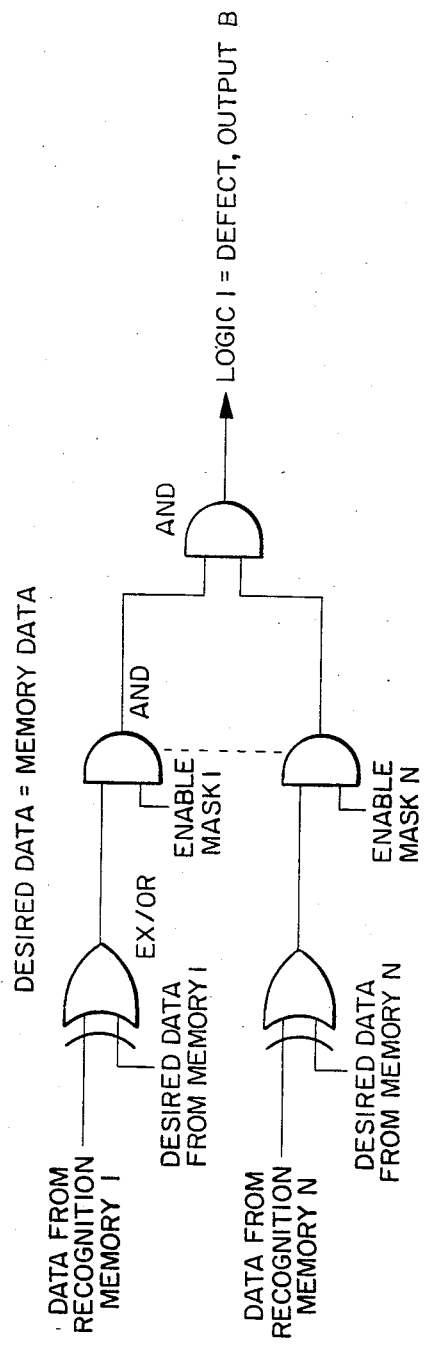
Figure 23C:
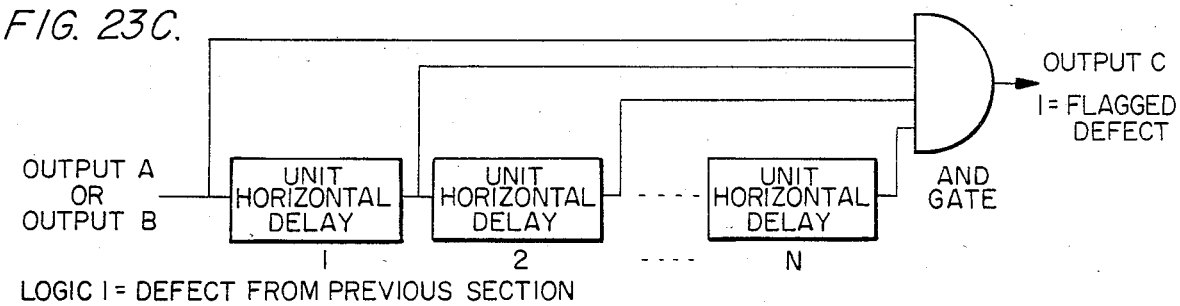

It is now in order to describe the operational units in the computer or processor above-referenced and suitable indicating or display apparatus. Referring now to FIGS. 23A, B, C, D and E, five units or operations of the computer or processor are illustrated with suitable circuit designs for performing the desired functions. FIG. 23A shows a circuit for indicating a defect or unkown and unlearned pattern present in an object under inspection. The circuit is designed such that an unknown pattern in any memory constitutes a defect in the object; such result being attained by providing that the data from each of the N recognition memories is logically ANDed with an enable gate, to determine if that memory is to be looked at; and the output of the N gates are all worked together. Thus, if a defect exits in the chosen memories, the defect will be indicated. Such indication can be presented to the operator by way of a number of different types of display devices, including the TV monitor M (FIG. 22), wherein the specific image which the system of the invention is actually viewing at the time that it detects a defect can be frozen and displayed. Thus in the system of FIG. 23A data from recognition memories 1-N are applied to respective gates receiving enabling signals from masks 1-N and provide an output A, such as a logic 1, representing a defect indicative of the fact that an unknown pattern has appeared in at least one of the memories. The circuitry of FIG. 23B insures that if defects exist simultaneously at chosen masks, then and only then is it considered that a defect actually exists in the object, as before explained. There is effected through the application of the desired data from the memory to respective EX/OR and AND gates, again enabled as in FIG. 23A, providing an output B in a final AND gate as indicated. FIG. 23C shows the application of output A of FIG. 23A or output B of FIG. 23B to an AND gate also inputted from successive unit horizontal delay elements 1-N. Again in this system, a logic 1 output would indicate a defect from the previous section; and if and only if a defect is detected at contiguous horizontal locations in the same horizontal line, would the machine indicate the actual presence of a defect in the object. This circuit thus enables the contiguous check of masks before described. A logic 1 in the output C would thus indicate that a defect was flagged by one or more recognition memories at each of the previous N horizontal positions.

Figure 23D:
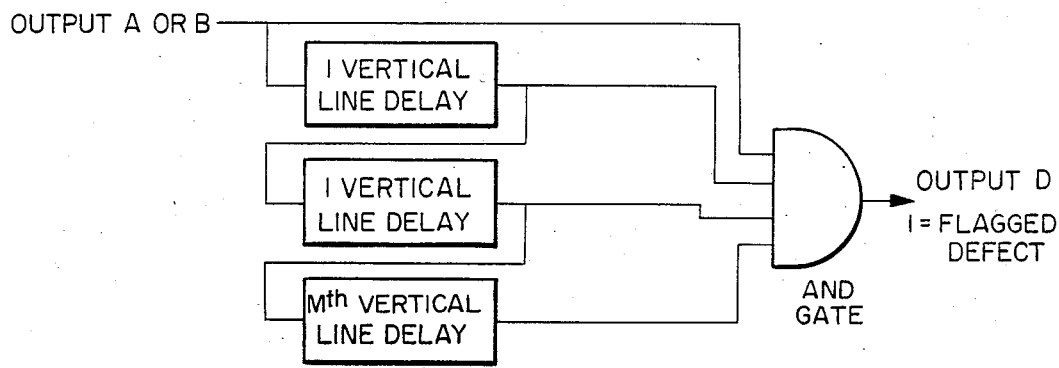

Similar circuitry for achieving the contiguous vertical mask defect verification before described is shown in FIG. 23D wherein successive vertical line delays input the final AND gate to produce output D. If and only if a defect is detected at M contiguous vertical locations at the same horizontal location does the circuit indicate the presence of a defect in the object. Thus a logic 1 in the output D indicates that a defect was flagged by one or more recognition memories at each of the previous M vertical lines at a common horizontal position.

Figure 23E:
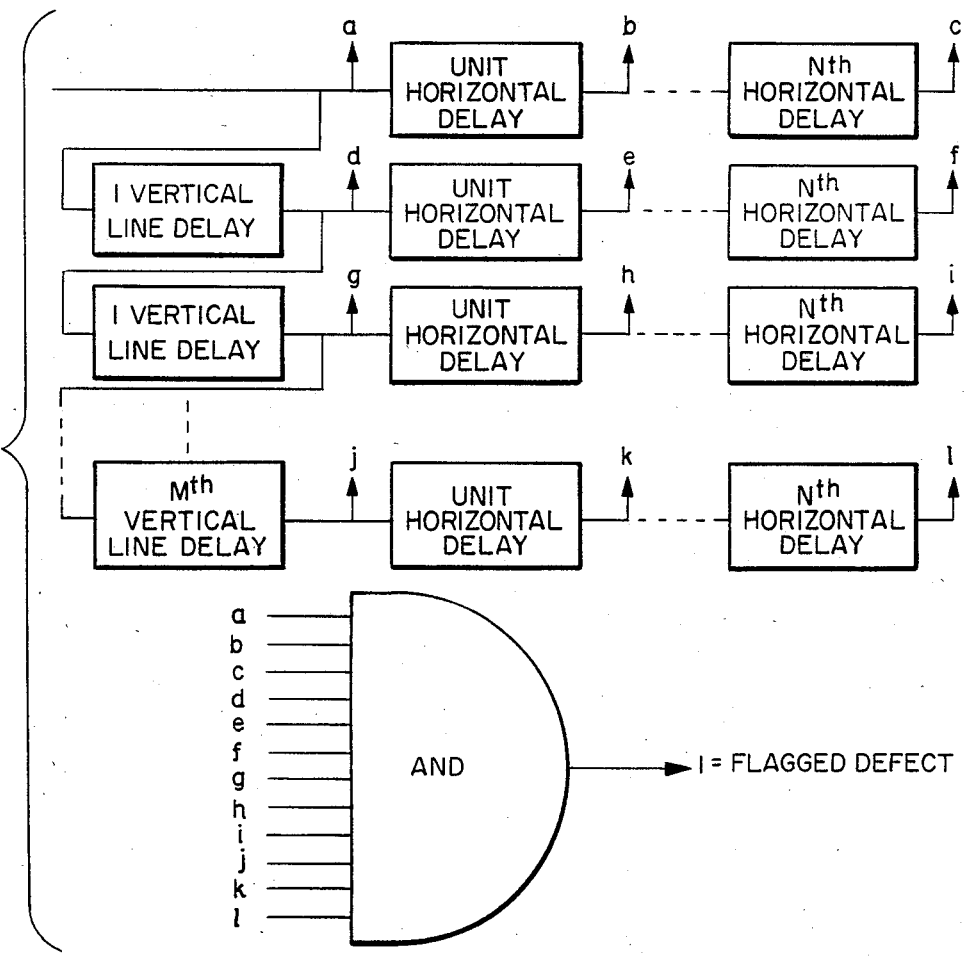

Lastly, the circuit of FIG. 23E achieves the "vibration" of the mask to insure indication of a genuine defect as previously explained. This combines the horizontal and vertical contiguous mask checking for defects with the outputs a-j from successive vertical line delays, the outputs b-k from unit horizontal delays, and the outputs c-L from the Nth horizontal delays, operating the final AND gate such that a logic 1 will indicate that a defect is present if and only if all previous N horizontal locations at each of the previous M vertical lines indicate a defect.

An operating system of the type shown in FIG. 22 had the following technical specifications and specific parts and equipment. The motor drive for an XY table (of Ralmike Corporation) was controlled by stepping motors (from Sigma Corporation). The imaging lens was a Photar enlarging lens by Leitz (130 mm), and the CCD camera was constructed by Beltronics of Brookline, Mass., using a Reticon 1728 element array. The clock drivers for the CCD were DS0026 National Company chips and the linear amplifiers and sampling-hold circuitry utilized LH0023 chips. The noise generators were: an H. H. Scott generator producing noise from 20 cycles to the 1 megahertz range, another generator that produced a pink noise spectrum from 20 hertz to 16 kilohertz, and a third generator by Wavetek producing noise from 0.003 hertz to 20 hertz. The pixel quantizer in this application was a single LM361 comparator. The two-dimensional buffer memory was constructed with a width of 2000 elements and a depth or vertical height of 64 lines. Referring to FIG. 22, and the two-dimensional buffer memory, L was equal to 2,000 and C/N equaled 64, being constructed using memory chips TMM 2016 by Toshiba in conjunction with shift registers 74S299 and latches 74LS374. Counters were 74163's, and gates were 7408's, and various multiplexers 74S151's. The TV memory buffer was constructed using Hitachi HM6167's, with count and control chips 74S173's and variety of 7408's, and gates and multiplexers. The TV monitor was produced by Panosonic. The sliding window memory was constructed using TMM2016's memory chips in conjunction with 74LS374's, 74S299's, and Data Delay Devices No. DDU5100, for providing accurate timing. The element computational unit was constructed using 74S374's to construct the various element sizes ranging from 1 to 64 pixels in size. The pixel sums were calculated using both proms 82S131 by Signetics and actual summing chips 74S283's. Their final sums were then latched into 74S174's. Having computed a sum of pixels, such is compared to its pixel threshold, with the comparison being performed using 74S85's. The element values were then sent into the individual element delay units constructed using 74S299's, 74LS374's, 74164's, and Hitachi TMM2016's. These element delay units were used to compute the mask addresses, which are applied to the recognition memories. The memories were implemented using Hitachi HM6167's memory chips. The computer or processor for interpreting and correlating pattern information was implemented using 74S86's to perform the exclusive OR function described in FIG. 23, in addition to the 74S64's and a variety of flip-flops. The delay lines were of the type TMM2016 to implement the various vertical delays necessary for some of the defect detection shown in FIG. 23; and again 74164's were used to implement some of the horizontal delays. Additional control logic contained 74S163's and 74S299's for enabling and disabling the appropriate masks at the correct time.

The overall systems specifications were as follows. For demonstration purposes, the XY table was capable of scanning an area 8 inches by 5 inches. Larger tables, however, that can easily scan two-foot squared areas and larger, can readily be hooked into the system. The resolution of the CCD system was of the order of 1 mil. The processing or data rate was from 5 megahertz (200 nanoseconds) to as low as 2 megahertz (500 nanoseconds). Operating the CCD at a 5 megahertz rate, the time required to clock out the complete array was half a millisecond; so that the time required to analyze a strip 8" long by 1" was 5 seconds. The time required to scan a PC card 8" by 10" was 50 seconds at 1X optical magnification. If operation is effected at a magnification of ½X, then the complete time required for analysis of the 10" by 8" card would be reduced to 12 seconds. It should be noted here that the only limitation in operating at ½X or 1X is the quality of the optical lens and not in any way the inspection system. In addition, these processing times of 50 seconds or 12 seconds are the times required with only one CCD camera and one complete analysis system. Clearly, such analysis systems can be cascaded by having multiple CCD's looking at the image such that the various sections of the image are overlapped. If this is done, there is actuallly no limit to the processing time. For example, even for 1X magnification where one unit would take 50 seconds, two units would take 25 seconds, five units would take 10 seconds, and the processing time is linearly proportional to the number of systems viewing the object.

As before discussed, where desired, the TV or other monitor M of FIG. 22 may have its image of the pattern of interest of the object, such as a defect, frozen on the screen with the aid of the TV memory buffer, so labelled, and with x-y or other coordinates or position of the same also recorded, as indicated.

It is to be understood that inspection apparatus and the like embodying the various features of the invention may, if desired, be used without all of the features incorporated therein, and that further modifications will occur to those skilled in this art, and such are considered to fall within the spirit and scope of the invention as defined in the appended claims.

What is claimed is:

1. A method of real-time inspection of objects at a predetermined region, that comprises, optically scanning successive lines of an area of interest of the object at said region; digitizing the scanned signals in real time to produce successive trains of digital signals corresponding to the optical scanned lines; delaying the successive trains of digital signals to produce a vertical raster of successive trains of digital signals corresponding to previously optically scanned lines; reducing the vertical raster to a sub-raster containing a predetermined number of substantially horizontal (H) and vertical (V) pixels; extracting from the sub-raster group of pixels h by v in spatial distribution such that $v_i \leq V$ and $h_i \leq H$, where the subscript i represents the specific elements ranging from an element one pixel in size to an element V by H in size; selecting an element threshold value for each element size by predetermining a minimum and maximum number of pixels such that if the number of pixels contained in an element lies within said minimum and maximum thresholds the element value is set to the value 0 or 1, with such thresholds varying with the size of the element; delaying each element by N, 2N, 3N, etc. horizontal pixels and by N, 2N, 3N, etc. vertical pixels to generate a mask representing a visual pattern wherein each element of the mask is displaced a full element from the previous or contiguous horizontal and vertical element; in a teaching mode, optically scanning a known object to generate a mask as above, serving as an address, and storing a code number at each address to teach the recognition of the desired object; when operating with an object to be inspected in run mode, reading the code number to determine if the mask generated during the optical scanning of the object to be inspected corresponds thereto indicating the recognition of the desired object, or does not correspond thereto; and indicating if the object has not been previously seen.

2. A method as claimed in claim 1 and in which the reading determines an object not corresponding to the code number, such as a defect; and indicating the presence of the defect.

3. A method as claimed in claim 1 and in which the element size is varied in effect to vary the magnification of inspection of the object.

4. A method as claimed in claim 1 and in which optical scanning is effected of a plurality of known objects, generating corresponding masks serving as addresses, with code numbers stored at each address that are distinctive or unique for each object.

5. A method of real-time high-speed inspection of objects with the aid of video pick-up cameras, that comprises, storing digital signal mask information corresponding to video images of regions of predetermined field of view of a known object at effectively different magnifications; successively scanning contiguous regions of an object with such a camera, for each of said predetermined fields of view, and digitizing in binary form the image scans to generate digital signal mask information; repeating such scanning at effectively greater magnification with the same field of view to generate magnified digital signal mask information; comparing the generated digital mask information at different magnifications with the stored digital mask information to identify known or unknown portions of the object; and indicating the identification of such known or unknown portions.

6. A method as claimed in claim 5 and in which the generating of digital signal mask information from said scanning at greater magnification is effected by averaging or weighting the digital binary data corresponding to picture points of the scanned image, such that a certain threshold number of common picture points or their corresponding binary units in the mask will determine the general white or black character of the same.

7. A method as claimed in claim 6 and in which the stored digital signal mask information comprises desired or good object portion masks, and said comparing step indicates defects or deviations by lack of matching the scan-generated digital signal mask information with the stored mask information.

8. A method as claimed in claim 6 and in which the stored digital signal mask information comprises predetermined defects or undesired deviations, and said comparing step identified such in the scan-generated digital signal mask information by matching with the stored mask information.

9. A method as claimed in claim 5 and in which the inspection steps are performed in parallel by a plurality of pick-up cameras scanning substantially overlapping areas of said objects.

10. A method as claimed in claim 5 and in which said indicating is effected by displaying said known or unknown portions on a monitor.

11. A method as claimed in claim 5 and in which the coordinates or location of said indicated known or unknown portions is indicated.

12. A method of real-time high-speed inspection of objects with the aid of image sensors and the like, that comprises, generating signal images of an object with such sensors at a plurality of magnifications; reconstructing said images into fields of view that employ a minimum number of predetermined required light levels or colors to distinguish features of such object; dividing each image field at each magnification into $N^2$ discrete spatial elements; and locating patterns of interest in such object by one or more of the following: (a) examining the $N^2$ elements from each magnification independently, searching for a pattern of interest within each field; (b) correlating patterns of the same object area generated at different magnifications; (c) combining pattern information generated from contiguous fields at a single magnification; and (d) recognizing pattern information combined from contiguous or overlapping fields at different magnifications, and correlating the obtained pattern information.

13. A method of real-time high-speed inspection of objects with the aid of image sensors and the like, that comprises, generating signal images in the form of pixels of an object with such sensors at one or more magnifications; relatively moving the object in a direction past the sensor; quantizing the pixels of the images into a minimum number of light levels or colors required to characterize the object; storing the quantized pixels to create a two-dimensional stored image equal to the largest desired field of view; selecting predetermined desired fields of view and magnification from said two-dimensional stored image; dividing each such selected field of view into $N^2$ elements; setting the brightness value of each element substantially equal to the average brightness value of the pixels contained within the element; quantizing each such element brightness value into a minimum number of threshold levels required to recognize patterns of interest; applying each $N^2$ quantized pixel group at each magnification as a pattern of elements to a corresponding recognition memory, with each pattern of elements serving as an address to said memory; entering information into accessed memory address locations in order to teach the properties of known objects and characteristics thereof for subsequent comparative use in the method; and thereafter recognizing such previously taught information as to objects and their characteristics by reading information in each memory location accessed by a pattern of elements and using such information to characterize the object.

14. A method as claimed in claim 13 and in which said threshold levels are supplemented by the introduction of noise corresponding to vibration and illumination variation during said inspection.

15. A method as claimed in claim 13 and in which the said recognizing involves verification of two adjacent location images to identify the characterization of the object or a part thereof.

16. A method as claimed in claim 13 and in which noise is generated of spectrum and amplitude that models the real noise variation that the image sensor system encounters in its actual operation of generating signal images, adding such modeled noise to the analog image signals; and with said quantizing comprising digitizing sampled image signals with added noise to enable the digital conversion to recognize said signals in all conditions of such actual operation.

17. A method as claimed in claim 13 and in which said recognizing comprises monitoring the characteristics in the patterns of the object image at adjacent locations in two dimensions to search for particular sub-patterns of interest; and indicating the detection of such sub-patterns only in the event that the monitoring at all of said adjacent two-dimensional locations indicates the presence of the sub-pattern.

18. A method as claimed in claim 17 and in which said sub-pattern is a defect or the like, and said two-dimensional locations comprise adjacent horizontal and adjacent vertical object images.

19. A method as claimed in claim 17 and in which said monitoring comprises storing, in succession, sets of bits representing a pair of horizontally adjacent patterns in a line scan of the image; and comparing the same with similar pattern information of a vertically displaced adjacent scanned line, such that only if all pairs of such pattern information sets of bits show the presence of the sub-pattern, is such indicating effected.

20. A method of real-time high speed inspection of objects, that comprises, presenting signals representing images of an object or parts thereof at effectively different magnifications to constant field-of-view processors, one corresponding to each magnification and having its own respective memory; storing the signals of the images in the respective memories, thereby to learn the shapes in the images; presenting signals representing images of objects-to-be-inspected at said effectively different magnifications to said constant-field-of-view corresponding processors; and comparing the said stored signals with the last-named signals to determine signals representative of shapes not previously learned.

21. A method as claimed in claim 20 and in which the signal images at different magnifications of the objects-to-be-inspected are pertubated by amounts small compared to the resolution element at the corresponding magnification to discriminate false errors from shapes not learned.

22. A method as claimed in claim 20 and in which the said presenting at effectively different magnifications is effected by providing signals in memory corresponding to an image having the lowest magnification, but with the resolution of the highest magnification; and extracting different portions of the image for the different magnifications and quantizing the same into sub-elements, the sub-elements making up the said constant field of view.

23. Apparatus for real-time high-speed inspection of objects with the aid of image sensors and the like, having, in combination, image sensing means for generating signal images in the form of pixels of an object at one or more magnifications; means for relatively moving the object in a direction past the sensing means; means for quantizing the pixels of the images into a minimum number of light levels or colors required to characterize the object; means for storing the quantized pixels to create a two-dimensional stored image equal to the largest desired field of view; means for selecting predetermined desired fields of view and magnification from said two-dimensional stored image; means for dividing each such selected field of view into $N^2$ elements; means for setting the brightness value of each element substantially equal to the average brightness value of the pixels contained within the element; means for quantizing each such element brightness value into a minimum number of threshold levels required to recognize patterns of interest; means for applying each $N^2$ quantized pixel group at each magnification as a pattern of elements to a corresponding recognition memory, with each pattern of elements serving as an address to said memory; means for entering information into memory address locations in order to teach the apparatus properties of known objects and characteristics thereof; and means for thereafter recognizing such previously taught information as to stored objects and their characteristics by means for reading information in each memory location accessed by a pattern of elements; and means for monitoring such information to characterize the object.

24. Apparatus as claimed in claim 23 and in which said threshold levels are supplemented by the introduction of noise corresponding to at least one of vibration and illumination variation during said inspection.

25. Apparatus as claimed in claim 23 and in which the said recognizing means comprises means for monitoring the characteristics in the patterns of the object image at adjacent locations in two dimensions to search for particular sub-patterns of interest; and means for indicating the detection of such sub-patterns only in the event that the monitoring at all of said adjacent two-dimensional locations indicates the presence of the sub-pattern.

26. Apparatus as claimed in claim 23 and which means is provided responsive to deviations from previously taught and/or stored information to indicate a non-conforming object or part thereof such as a defect and the like.

27. Apparatus as claimed in claim 26 and in which means is provided for displaying the non-conforming object or part thereof.

28. Apparatus as claimed in claim 26 and in which means is provided for indicating the coordinates or location of the non-conforming object or part thereof.

29. Apparatus as claimed in claim 23 and in which the sensing means comprises a plurality of pick-up cameras for scanning substantially overlapping areas of objects.

30. Apparatus for real-time high-speed inspection of objects with the aid of image sensors and the like, having, in combination, image sensing means for generating signal images of an object at a plurality of magnifications; means for reconstructing said images into fields of view that employ a minimum number of predetermined required light levels or colors to distinguish features of such object; means for dividing each image field at each magnification into $N^2$ discrete spatial elements; and means for locating patterns of interest in such object by one or more of the following: (a) means for examining the $N^2$ elements from each magnification independently to locate a pattern of interest within each field; (b) means for correlating patterns of the same object areas generated at different magnifications; (c) means for combining pattern information generated from contiguous fields at a single magnification; and (d) means for recognizing pattern information combined from contiguous or overlapping fields at different magnifications to correlate the obtained pattern information.

31. Apparatus for real-time high-speed inspection of objects having, in combination, means for scanning the objects; means responsive to the scanning for storing digital signal mask information of such scanning of the objects at different magnifications but with substantially the same field of view; means for teaching the apparatus information on known or desired objects by scanning the same and storing the resulting digital signal mask information; and means for comparing digital mask information obtained by run scans of objects-to-be-inspected, at said different magnifications, with the stored signal mask information; and means responsive to said comparing for differentiating the presence of desired objects or objects deviating therefrom.

32. Apparatus as in claim 31 and in which means is provided for rendering the same substantially independent of orientation of the object presented to the scanning means.

* * * * *